United States Patent
Yoo et al.

(10) Patent No.: US 7,446,337 B2
(45) Date of Patent: *Nov. 4, 2008

(54) THIN FILM TRANSISTOR SUBSTRATE USING A HORIZONTAL ELECTRIC FIELD

(75) Inventors: Soon Sung Yoo, Gumpo-si (KR); Oh Nam Kwon, Yongin-si (KR); Heung Lyul Cho, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/544,748

(22) Filed: Oct. 10, 2006

(65) Prior Publication Data

US 2007/0029551 A1 Feb. 8, 2007

Related U.S. Application Data

(62) Division of application No. 10/978,522, filed on Nov. 2, 2004, now Pat. No. 7,132,688.

(30) Foreign Application Priority Data

Nov. 4, 2003 (KR) .......................... 10-2003-77661

(51) Int. Cl.
H01L 31/20 (2006.01)

(52) U.S. Cl. .................. 257/59; 257/72; 257/E29.291; 257/E29.294; 257/E21.414; 349/43; 349/141

(58) Field of Classification Search .................. 257/59, 257/E29.291
See application file for complete search history.

(56) References Cited

U.S. PATENT DOCUMENTS

| 6,337,726 B1* | 1/2002 | Kawano et al. ............. 349/141 |
| 6,833,893 B2* | 12/2004 | Kikkawa ..................... 349/117 |
| 2003/0122990 A1 | 7/2003 | Kim ............................ 349/43 |
| 2005/0046776 A1* | 3/2005 | Ahn et al. .................... 349/141 |
| 2005/0110931 A1* | 5/2005 | Yoo et al. .................... 349/141 |

FOREIGN PATENT DOCUMENTS

| KR | 10-2003-0057149 A | 7/2003 |
| KR | 10-2003-0058511 A | 7/2003 |

* cited by examiner

Primary Examiner—Tu-Tu V Ho
(74) Attorney, Agent, or Firm—Morgan Lewis & Bockuis LLP

(57) ABSTRACT

A thin film transistor substrate structure for using a horizontal electric field includes a substrate; a gate line and a first common line formed on the substrate parallel to each other from a first conductive layer; a gate insulating film formed on the substrate, the gate line, and the first common line; a data line formed from a second conductive layer on the gate insulating film crossing the gate line and the common line with the gate insulating film therebetween to define a pixel area; a thin film transistor connected to the gate line and the data line; a protective film covering the data line and the thin film transistor; a common electrode formed from a third conductive layer connected to the common line through a hole passing through the protective film and the gate insulating film; and a pixel electrode formed from the second conductive layer connected to the thin film transistor to define a horizontal electric field between the pixel electrode and the common electrode.

7 Claims, 22 Drawing Sheets

THIN FILM TRANSISTOR SUBSTRATE USING A HORIZONTAL ELECTRIC FIELD

This application is a divisional of U.S. patent application No. Ser. No. 10/978,522, filed Nov. 2, 2004 and registered on Nov. 2, 2004 as a U.S. Pat. No. 7,132,688, and claims the benefit of Korean Patent Application No. 10-2003-77661, filed Nov. 4, 2003, both of which are hereby incorporated by reference.

BACKGROUND OF THE INVENTION

1. Field of the Invention

The present invention relates to a liquid crystal display, and more particularly, to a thin film transistor substrate using a horizontal electric field and a fabricating method thereof.

2. Description of the Related Art

Generally, liquid crystal display (LCD) devices control light transmittance of liquid crystal using an electric field, to thereby display a picture. The liquid crystal displays are largely classified into a vertical electric field type and a horizontal electric field type depending upon the direction of the electric field driving the liquid crystal. The vertical electric field type drives a liquid crystal in a twisted nematic (TN) mode with a vertical electric field formed between a pixel electrode and a common electrode arranged in opposition to each other on the upper and lower substrates. The vertical electric field type has the advantage of a large aperture ratio while having the drawback of a narrow viewing angle of about 90°. The horizontal electric field type drives a liquid crystal in an in plane switch (IPS) mode with a horizontal electric field between the pixel electrode and the common electrode arranged in parallel to each other on the lower substrate. The horizontal electric field type has the advantage of a wide viewing angle of about 160°. Hereinafter, the liquid crystal display of horizontal electric field type will be described in detail.

The horizontal electric field type includes a thin film transistor array substrate (i.e., a lower substrate) and a color filter substrate (i.e., an upper substrate) that oppose each other and are joined to each other. A spacer is positioned between the two substrates to uniformly maintaining a cell gap between the two substrates. A liquid crystal material fills the cell gap between the two substrates. The thin film transistor array substrate includes a plurality of signal wirings for forming a horizontal electric field in each pixel, a plurality of thin film transistors and an alignment film for aligning the liquid crystal. The color filter substrate includes a color filter for implementing a color, a black matrix for preventing light leakage and an alignment film for aligning the liquid crystal.

In a horizontal electric field type liquid crystal display, the complicated fabrication of the thin film transistor substrate is a major cost factor in the manufacturing of the liquid crystal display panel because it involves a plurality of masking processes. For example, one mask process includes a lot of processes, such as thin film deposition, cleaning, photolithography, etching, photo-resist stripping and inspection processes. In order to address this issue, thin film transistor substrates have been developed that can be produced with the reduced number of masking processes. Recently, a four-mask process that excludes one mask process from the standard five-mask process has been developed.

FIG. 1 is a plan view showing a structure of a thin film transistor substrate of a horizontal electric field type liquid crystal display made using the related art four-mask process. FIG. 2 is a cross-sectional view of the thin film transistor substrate taken along the line I-I' and the line II-II' in FIG. 1.

As shown in FIG. 1 and FIG. 2, the thin film transistor substrate includes a gate line 2 and a data line 4 provided on a lower substrate 45 in such a manner as to cross each other with a gate insulating film 46 therebetween. A thin film transistor 6 is adjacent to each crossing. A pixel electrode 14 and a common electrode 18 are provided at a pixel area, which is defined by the gate line 2 and the data line 4 for the purpose of forming a horizontal field. A common line 16 is connected to the common electrode 18. The thin film transistor substrate also includes a storage capacitor 20 provided at an overlap portion between the pixel electrode 14 and the common line 16. Further, a gate pad 24 is connected to the gate line 2, a data pad 30 is connected to the data line 4 and a common pad 36 is connected to the common line 16. The gate line 2 supplies a gate signal to the pixel area 5 and the data line 4 supplies a data signal to the pixel area 5. The common line 16 supplies a reference voltage for driving the liquid crystal and is provided on one side of the pixel area 5 in parallel with the gate line 2 on the other side of the pixel area 5.

The thin film transistor 6 allows the pixel signal of the data line 4 to be charged and maintained on the pixel electrode 14 in response to the gate signal of the gate line 2. The thin film transistor 6 includes a gate electrode 8 connected to the gate line 2, a source electrode 10 connected to the data line 4, and a drain electrode 12 connected to the pixel electrode 14. Further, the thin film transistor 6 includes an active layer 48 defining a channel between the source electrode 10 and the drain electrode 12. The active layer 48 overlaps a gate insulating film 46 on the gate electrode 8.

The active layer 48 also overlaps the data line 4, lower data pad electrode 32 and upper storage electrode 22. An ohmic contact layer 50 for making an ohmic contact with the data line 4 is provided on the active layer 48. In addition, the source electrode 10, the drain electrode 12, the lower data pad electrode 32 and the upper storage electrode 22 are also provided on the active layer 48.

The pixel electrode 14 is connected, via a first contact hole 13 through a protective film 52, to the drain electrode 12 of the thin film transistor 6 and is provided within the pixel area 5. The pixel electrode 14 includes a first horizontal portion 14A connected to the drain electrode 12 and provided in parallel with adjacent gate lines 2, a second horizontal portion 14B overlapping the common line 16, and a finger portion 14C provided in parallel between the first and second horizontal portions 14A and 14B.

The common electrode 18 is connected to the common line 16 and is provided within the pixel area 5. Specifically, the common electrode 18 is provided in parallel with the finger portion 14C of the pixel electrode 14 within the pixel area 5. Accordingly, a horizontal electric field can be formed between the pixel electrode 14 to which a pixel signal is supplied via the thin film transistor 6 and the common electrode 18 to which a reference voltage is supplied via the common line 16. As a result, a horizontal electric field can be formed between the finger portion 14C of the pixel electrode 14 and the common electrode 18. Liquid crystal molecules arranged in the horizontal direction between the thin film transistor substrate and the color filter substrate by such a horizontal electric field are rotated due to the dielectric anisotropy. Transmittance of a light transmitting the pixel area 5 is differentiated depending upon a rotation extent of the liquid crystal molecules, thereby implementing a gray level scale.

The storage capacitor 20 includes an upper storage electrode 22 overlapping the common line 16 with the gate insulating film 46, the active layer 48 and the ohmic contact layer 50 therebetween. The storage capacitor 20 further includes a pixel electrode 14 connected, via a second contact hole 21 provided in the protective film 52, to the upper storage electrode 22. The storage capacitor 20 allows a pixel signal charged on the pixel electrode 14 to be stably maintained until the next pixel signal is charged.

The gate line 2 is connected, via the gate pad 24, to a gate driver (not shown). The gate pad 24 consists of a lower gate pad electrode 26 extending from the gate line 2 and an upper gate pad electrode 28 connected, via a third contact hole 27 through the gate insulating film 46 and the protective film 52, to the lower gate pad electrode 26. The data line 4 is connected via the data pad 30 to the data driver (not shown). The data pad 30 consists of a lower data pad electrode 32 extending from the data line 4 and an upper data pad electrode 34 connected, via a fourth contact hole 33 through the protective film 52, to the lower data pad electrode 32. The common line 16 receives a reference voltage from an external reference voltage source (not shown) through the common pad 36. The common pad 36 includes a lower common pad electrode 38 extending from the common line 16 and an upper common pad electrode 40 connected, via a fifth contact hole 39 through the gate insulating film 46 and the protective film 52, to the lower common pad electrode 38.

A method of fabricating the thin film transistor substrate having the above-mentioned structure using the four-round mask process will be described in detail with reference to FIGS. 3A to 3D. Referring to FIG. 3A, a gate metal pattern group including the gate line 2, the gate electrode 8 and the lower gate pad electrode 26, the common line 16, the common electrode 18 and the lower common pad electrode 38 is provided on the lower substrate 45 by a first mask process.

The gate metal pattern group is formed by first forming a gate metal layer on the upper substrate 45 by a deposition technique, such as sputtering. Then, the gate metal layer is patterned by photolithography and an etching process using a first mask, to thereby form the gate metal pattern group including the gate line 2, the gate electrode 8, the lower gate pad electrode 26, the common line 16, common electrode 18 and the lower common pad electrode 38. The gate metal layer is formed from a metal, such as aluminum-alloy, chrome (Cr) or molybdenum (Mo).

Referring to FIG. 3B, the gate insulating film 46 is coated onto the lower substrate 45 provided with the gate metal pattern group. Further, a semiconductor pattern including the active layer 48 and the ohmic contact layer 50, and a source/drain metal pattern group including the data line 4, the source electrode 10, the drain electrode 12, the lower data pad electrode 32 and the upper storage electrode 22 are provided on the gate insulating film 46 by a second mask process. More specifically, the gate insulating film 46, an amorphous silicon layer, an $n^+$ amorphous silicon layer and a source/drain metal layer are sequentially provided over the lower substrate 45 having the gate metal pattern group by the appropriate deposition techniques, such as plasma enhanced chemical vapor deposition (PECVD) and/or sputtering. Herein, the gate insulating film 46 is formed from an inorganic insulating material, such as silicon nitride ($SiN_x$) or silicon oxide ($SiO_x$). The source/drain metal is made from molybdenum (Mo), titanium (Ti), tantalum (Ta) or a molybdenum alloy.

Then, a photo-resist pattern is formed on the source/drain metal layer by the photolithography using the second mask. In this case, a diffractive exposure mask having a diffractive exposing portion corresponding to a channel portion of the thin film transistor is used as the second mask, thereby allowing a photo-resist pattern of the channel portion to have a height lower than other pattern portions.

Subsequently, the source/drain metal layer is patterned by a wet etching process using the photo-resist pattern, to thereby define the source/drain metal pattern group including the data line 4, the source electrode 10, the drain electrode 12 being integral to the source electrode 10 and the upper storage electrode 22.

Next, the photo-resist pattern having a relatively low height is removed from the channel portion by an ashing process and thereafter the source/drain metal pattern and the ohmic contact layer 50 of the channel portion are etched by a dry etching process. Thus, the active layer 48 of the channel portion is exposed to disconnect the source electrode 10 from the drain electrode 12. Then, the photo-resist pattern remaining on the source/drain metal pattern group is removed by a stripping process.

Referring to FIG. 3C, the protective film 52 includes first to fifth contact holes 13, 21, 27, 33 and 39 formed in the gate insulating film 46 by a third mask process. More specifically, the protective film 52 is deposited over the entire surface of the source/drain metal pattern group by a deposition technique, such as plasma enhanced chemical vapor deposition (PECVD). The protective film 52 is patterned by a photolithography and etching process using a third mask to define the first to fifth contact holes 13, 21, 27, 33 and 39. The first contact hole 13 passes through the protective film 52 to expose the drain electrode 12. The second contact hole 21 passes through the protective film 52 to expose the upper storage electrode 22. The third contact hole 27 passes through the protective film 52 and the gate insulating film 46 to expose the lower gate pad electrode 26. The fourth contact hole 32 passes through the protective film 52 to expose the lower data pad electrode 32. The fifth contact hole 30 passes through the protective film 52 and the gate insulating film 48 to expose the lower common pad electrode 38. If the source/drain metal is formed from a metal having a high dry-etching ratio, such as molybdenum (Mo), then the first, second and fourth contact holes 13, 21 and 33 will respectively pass through the drain electrode 12, the upper storage electrode 22 and the lower data pad electrode 32 so as to expose side surfaces of these electrodes. The protective film 50 is formed from an inorganic material identical to the gate insulating film 46, or an organic material having a low dielectric constant, such as an acrylic organic compound, BCB (benzocyclobutene) or PFCB (perfluorocyclobutane).

Referring to FIG. 3D, a transparent conductive film pattern group including the pixel electrode 14, the upper gate pad electrode 28, the upper data pad electrode 34 and the upper common pad electrode 40 are provided on the protective film 52 by a fourth mask process. More specifically, a transparent conductive film is coated onto the protective film 52 by a deposition technique, such as sputtering. Then, the transparent conductive film is patterned by a photolithography and etching process using the fourth mask to form the transparent conductive pattern group including the pixel electrode 14, the upper gate pad electrode 28, the upper data pad electrode 34 and the upper common pad electrode 40. The pixel electrode 14 is electrically connected, via the first contact hole 13, to the drain electrode 12 while also being electrically connected, via the second contact hole 21, to the upper storage electrode 22. The upper gate pad electrode 28 is electrically connected, via the third contact hole 37, to the lower gate pad electrode 26. The upper data pad electrode 34 is electrically connected, via the fourth contact hole 33, to the lower data pad electrode 32. The upper common pad electrode 40 is electrically connected, via the fifth contact hole 39, to the lower common pad electrode 38. The transparent conductive film is formed from indium-tin-oxide (ITO), tin-oxide (TO) or indium-zinc-oxide (IZO).

The related art thin film transistor substrate of horizontal electric field type and the fabricating method thereof as mentioned above uses a four-round mask process, thereby reducing the number of fabricating processes and hence reducing manufacturing cost in comparison with those using the five-round mask process. However, since the four-round mask process still is a complicated fabricating process. Thus, cost reduction is limited. There is still a need to simplify the fabricating process and reduce the manufacturing cost.

SUMMARY OF THE INVENTION

Accordingly, the present invention is directed to a thin film transistor substrate using a horizontal electronic field and fabricating method thereof that substantially obviates one or more of the problems due to limitations and disadvantages of the related art.

Accordingly, it is an object of the present invention to provide a thin film transistor substrate using a horizontal electric field and a fabricating method thereof that has a simplified fabricating process.

Another object of the present invention is to provide a thin film transistor substrate using a horizontal electric field and a fabricating method thereof that has an improved lift-off process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor substrate structure for using a horizontal electric field comprises a substrate; a gate line and a common line formed on the substrate parallel to each other from a first conductive layer; a gate insulating film formed on the substrate, the gate line, and the common line; a data line formed from a second conductive layer on the gate insulating film crossing the gate line and the common line with the gate insulating film therebetween to define a pixel area; a thin film transistor connected to the gate line and the data line; a protective film covering the data line and the thin film transistor; a common electrode formed from a third conductive layer connected to the common line through a hole passing through the protective film and the gate insulating film, the common electrode deposed within the hole; and a pixel electrode formed from the second conductive layer connected to the thin film transistor to define a horizontal electric field between the pixel electrode and the common electrode.

In another aspect, method of fabricating a thin film transistor substrate structure which uses a horizontal electric field comprises the steps of forming a gate line, a gate electrode connected to the gate line, and a common line being parallel to the gate line by patterning a first conductive layer formed on a substrate; coating a gate insulating film on the substrate, the gate line, the gate electrode, and the common line; forming a semiconductor pattern on a portion of the gate insulating film; forming a data line crossing the gate line and the common line to define a pixel area, a source electrode connected to the data line, and a drain electrode by patterning a second conductive layer, the source electrode and the drain electrode opposing each other on the semiconductor pattern; forming a pixel electrode connected to the drain electrode at the pixel area; coating a protective film on the pixel electrode, the data line, the common line, the source electrode, and the drain electrode; patterning the protective film and the gate insulating film to provide a hole exposing a portion of the common line at the pixel area; and forming a common electrode connected to the exposed portion of the common line through the hole, the common electrode disposed within the hole, the common electrode and the pixel electrode disposed to define a horizontal electric field.

In another aspect, a method of fabricating a thin film transistor substrate structure which uses a horizontal electric field comprises a first mask process of forming a gate line, a gate electrode connected to the gate line, and a common line being parallel to the gate line by patterning a first conductive layer formed on a substrate; coating a gate insulating film on the substrate, the gate line, the gate electrode, and the common line; a second mask process of forming a semiconductor pattern on a portion of the gate insulating film, forming a data line crossing the gate line and the common line to define a pixel area, a source electrode connected to the data line, and a drain electrode by patterning a second conductive layer, the source electrode and the drain electrode opposing each other on the semiconductor pattern, and forming a pixel electrode connected to the drain electrode at the pixel area; coating a protective film on the pixel electrode, the data line, the common line, the source electrode, and the drain electrode; and a third mask process of patterning the protective film and the gate insulating film to provide a hole exposing a portion of the common line at the pixel area, and forming a common electrode connected to the exposed portion of the common line through the hole, the common electrode disposed within the hole, the common electrode and the pixel electrode disposed to define a horizontal electric field.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
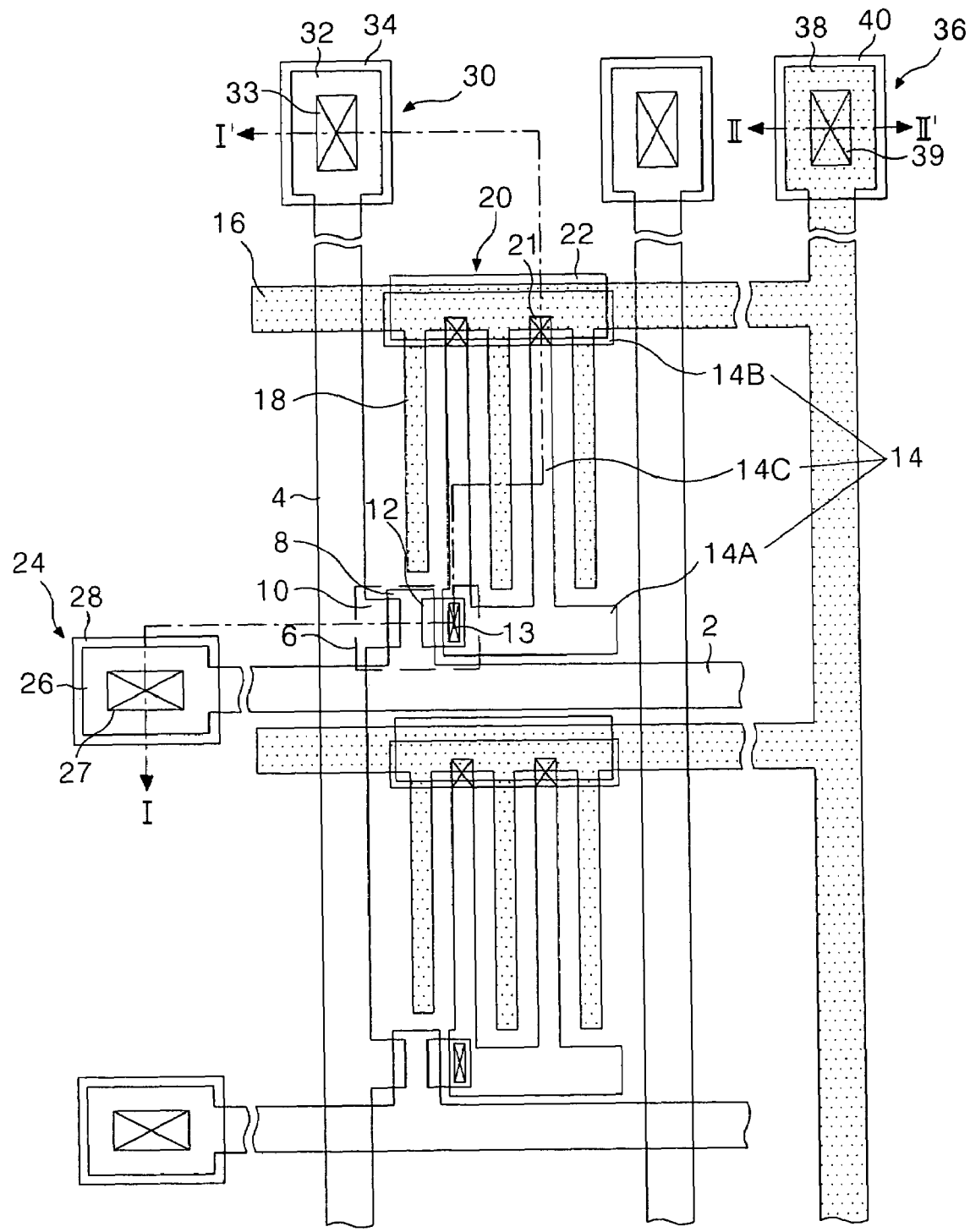
FIG. 1 is a plan view showing a structure of a related art thin film transistor substrate of a liquid crystal device using a horizontal electric field.
Figure 2:
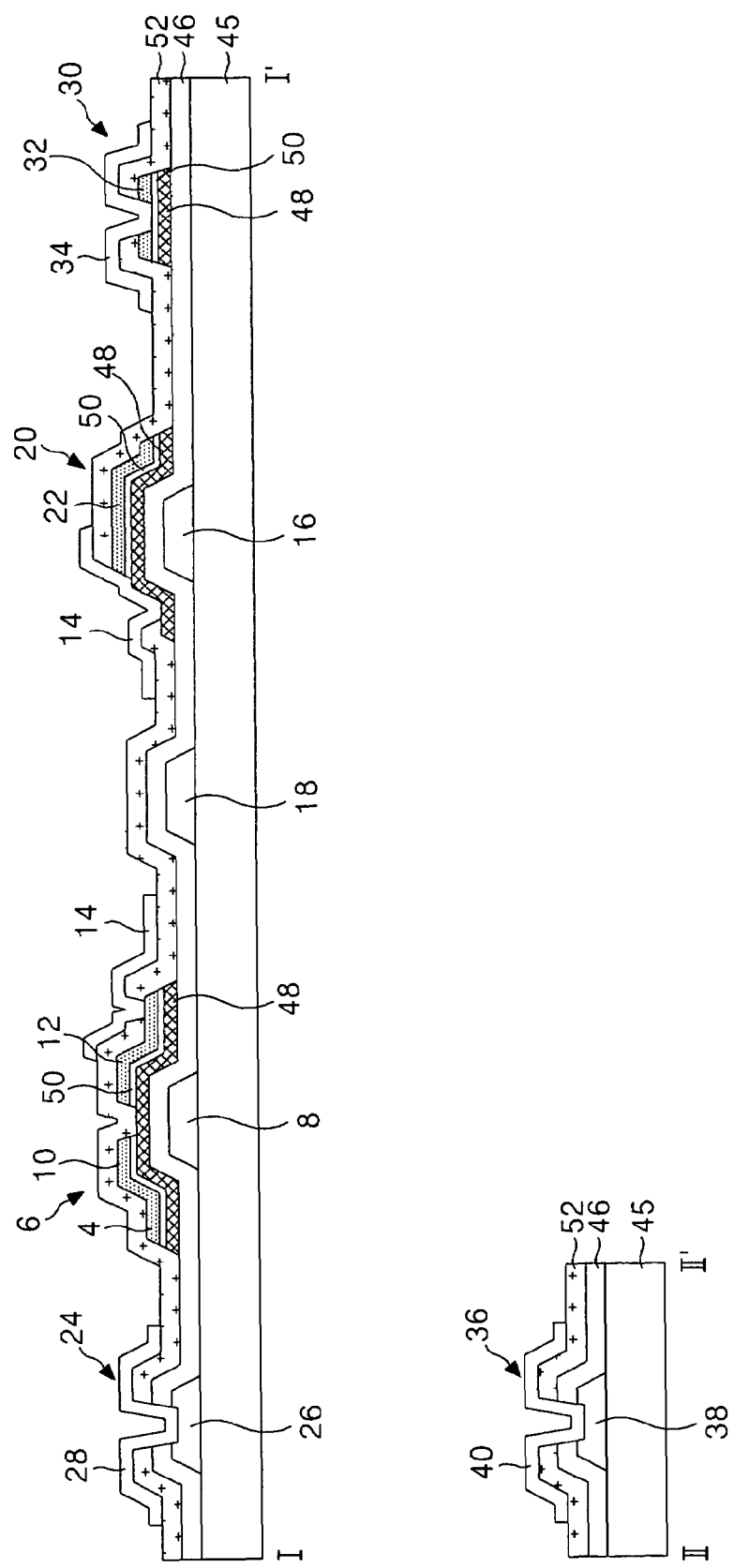
FIG. 2 is a cross-sectional view of the thin film transistor substrate taken along the cross-sectional lines I-I' and II-II' in FIG. 1.
Figure 3A:
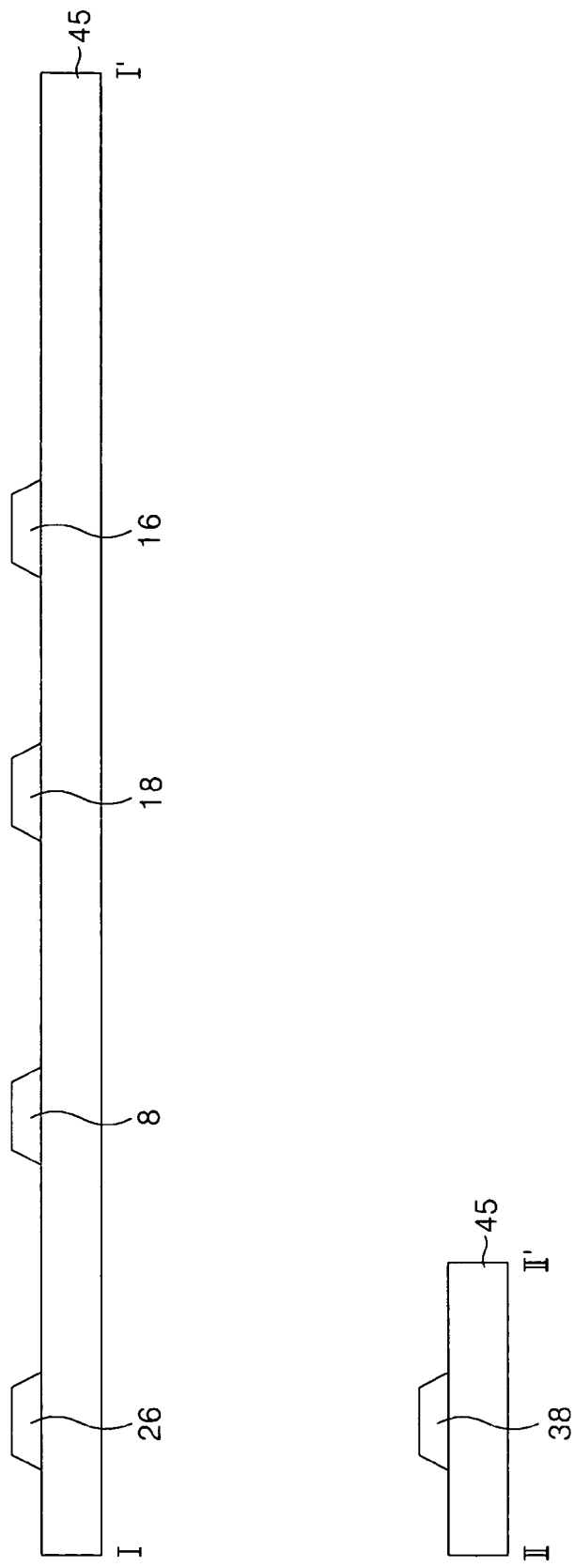
FIGS. 3A to 3D are cross-sectional views illustrating a method of fabricating the thin film transistor substrate shown in FIG. 2.
Figure 3B:
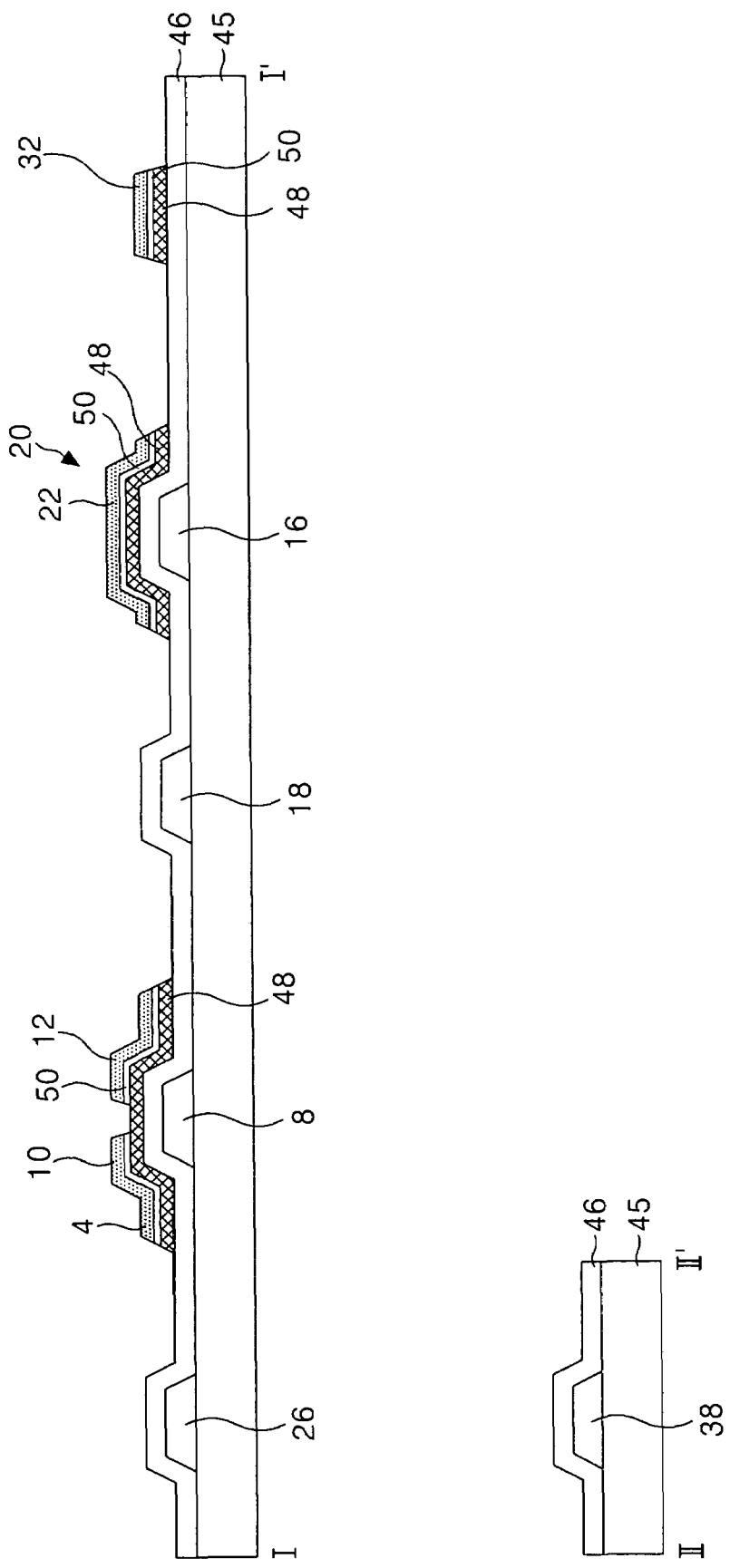
Figure 3C:
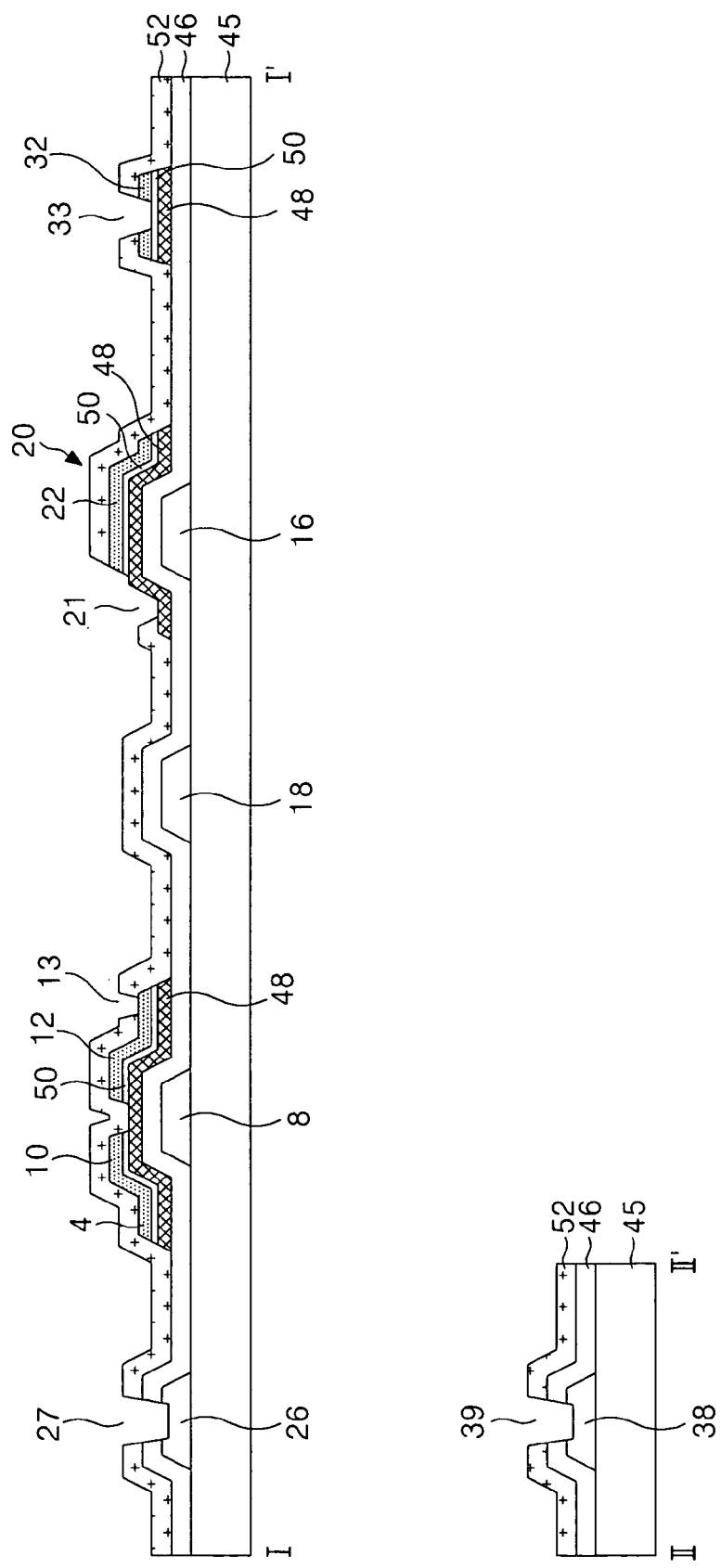
Figure 3D:
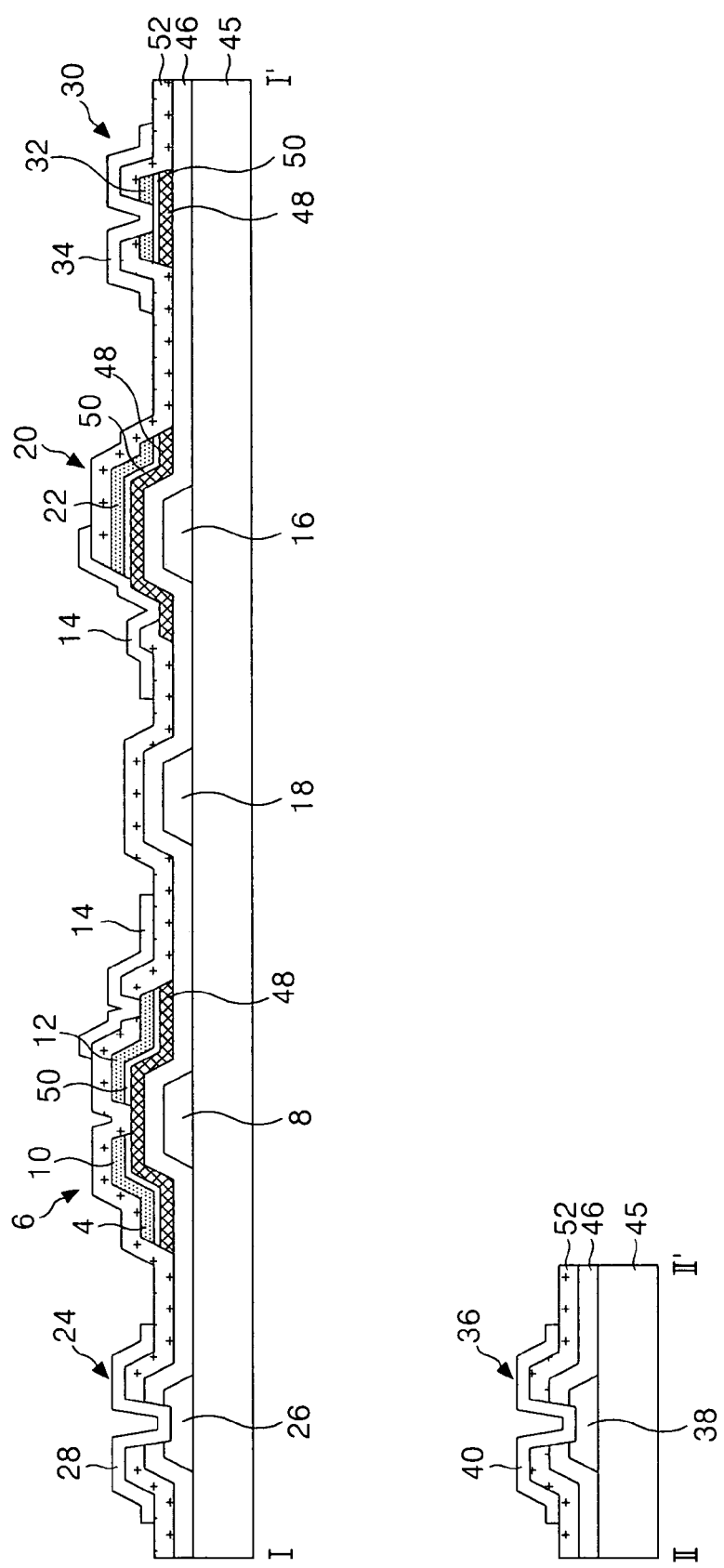
Figure 4:
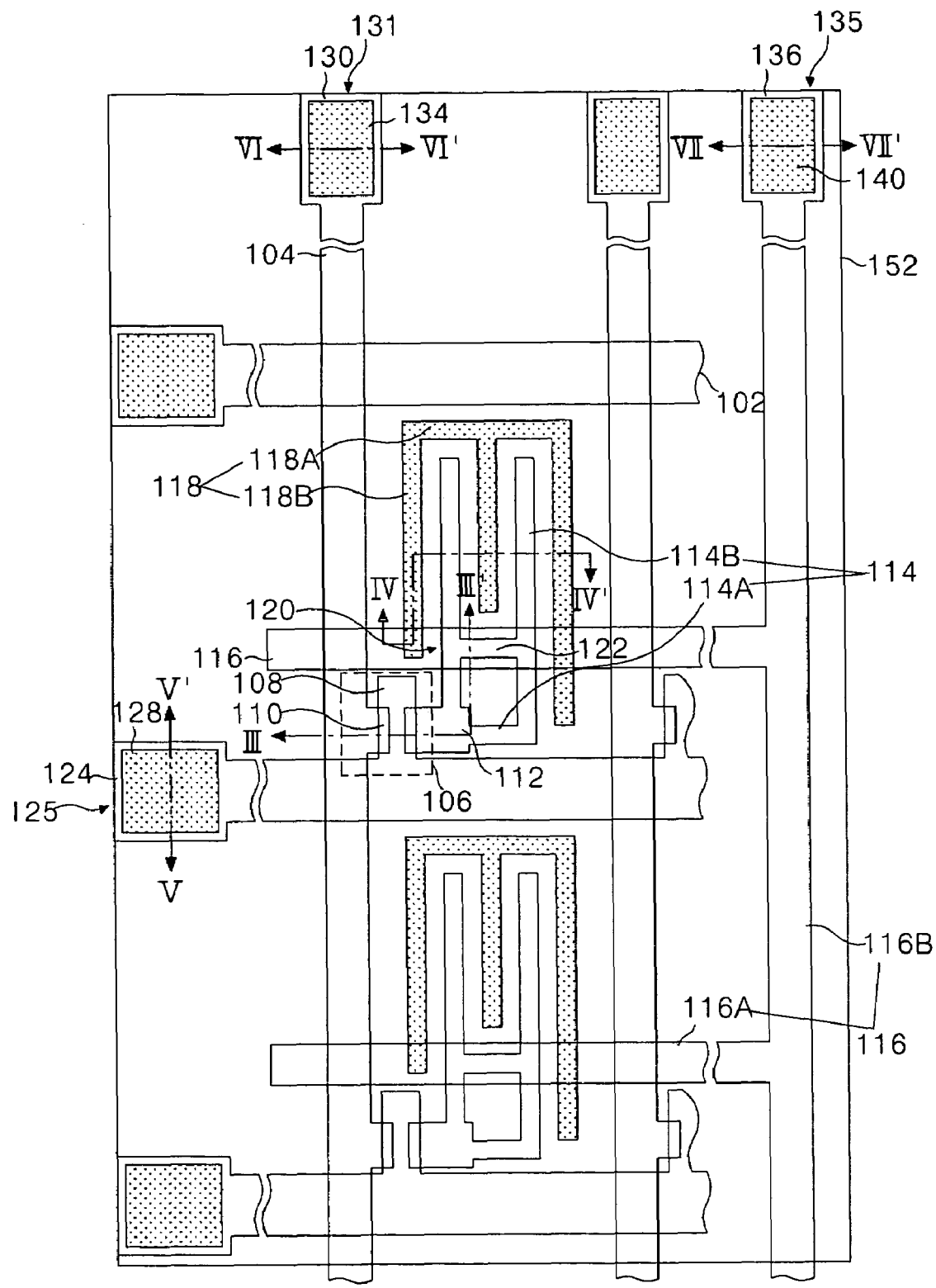
FIG. 4 is a plan view showing a structure of a thin film transistor substrate of horizontal electric field type according to an exemplary embodiment of the present invention.
Figure 5:
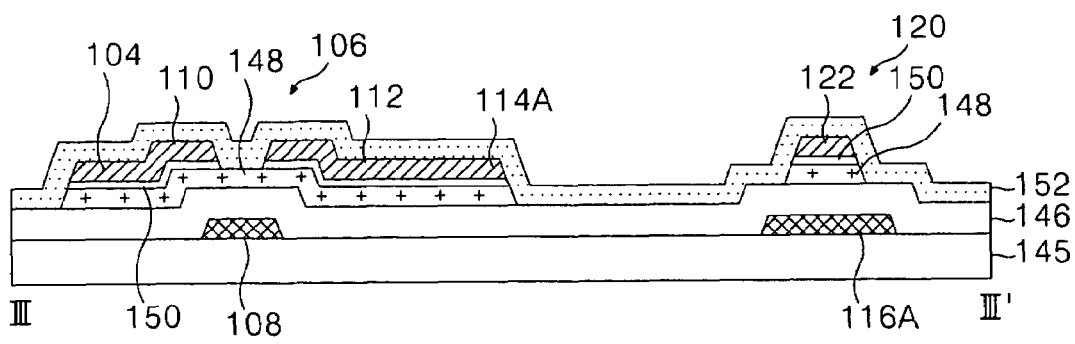
FIG. 5 is a cross-sectional view of the thin film transistor substrate taken along cross-sectional lines III-III', IV-IV', V-V', VI-VI', VII-VII' and VII-VII' and in FIG. 4.
Figure 5:
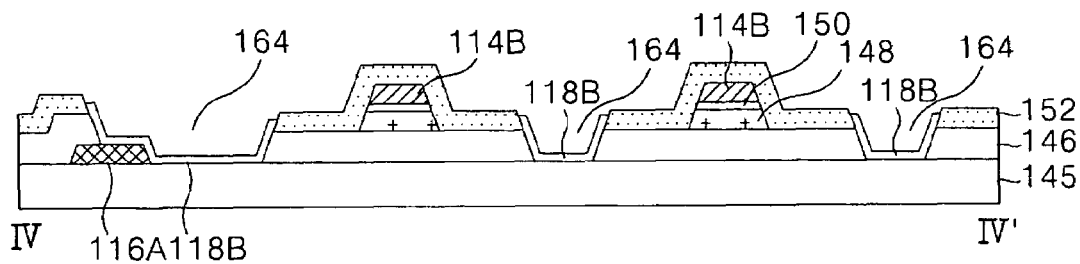
Figure 5:
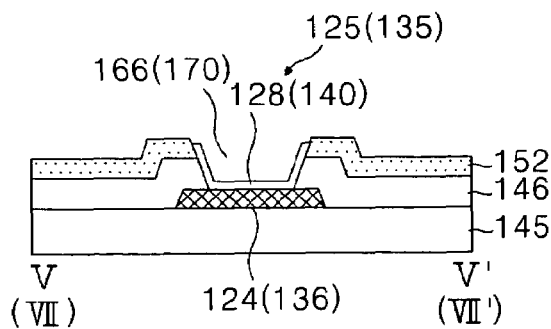
Figure 5:
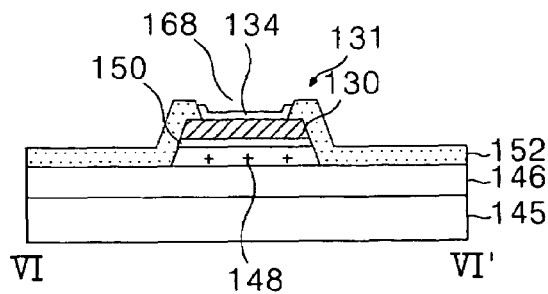

Hereinafter, exemplary embodiments of the present invention will be described in detail with reference to FIGS. 4 to 10D. FIG. 4 is a plan view showing a structure of a thin film transistor substrate using a horizontal electric field according to an embodiment of the present invention. FIG. 5 is a cross-sectional view of the thin film transistor substrate taken along cross-sectional lines III-III', IV-IV', V-V', VI-VI', VII-VII', VIII-VIII' of FIG. 4.

Referring to FIG. 4 and FIG. 5, the thin film transistor substrate includes a gate line 102 and a data line 104 provided on a lower substrate 145 intersecting each other with a gate insulating film 146 therebetween, a thin film transistor 106 provided at each intersection, a pixel electrode 114 and a common electrode 118 provided at a pixel area defined by the intersection for forming a horizontal field, and a common line 116 connected to the common electrode 118. Further, the thin film transistor substrate includes a storage capacitors 120 provided at an overlapped portion among a pre-stage gate line 102, the common line 116, the common electrode 118 and an upper storage electrode 122, a gate pad 125 connected to the gate line 102, a data pad 131 connected to the data line 104, and a common pad 135 connected to the common line 116.

The gate line 102 to be supplied with a gate signal and the data line 104 to be supplied with a data signal intersect each other to defined a pixel area. Herein, the gate line 102 is formed from a first conductive layer (i.e., a gate metal layer) while the data line 104 is formed from a second conductive layer (i.e., a source/drain metal layer).

The thin film transistor 106 allows the pixel signal of the data line 104 to be charged and maintained in the pixel electrode 114 in response to the gate signal of the gate line 102. To this end, the thin film transistor 106 includes a gate electrode 108 connected to the gate line 102, a source electrode 110 connected to the data line 104, a drain electrode 112 opposed to the source electrode 110, an active layer 148 overlapping the gate electrode 108 with a gate insulating film 146 therebetween to define a channel between the source electrode 110 and the drain electrode 112, and an ohmic contact layer 150 provided on the active layer 148 excluding the channel to make an ohmic contact with the source electrode 110 and the drain electrode 112.

Further, the active layer 148 and the ohmic contact layer 150 overlaps the data line 104, a lower data pad electrode 130 and the upper storage electrode 122 that are formed from a second conductive layer along with the source electrode 110 and the drain electrode 112.

The common line 116 and the common electrode 118 supply a reference for driving the liquid crystal material. The common line 116 includes a first common line 116A arranged across a pixel area along with the gate line 102 at a display area, and a second common line 116B commonly connected a plurality of first common line 116A at a non-display area. The common line 116 is formed from a first conductive layer (or gate metal layer) along with the gate line 102.

The common electrode 118 is connected to the first common line 116A and is formed in a finger shape at the pixel area to be parallel with the pixel electrode 114. More specifically, the common electrode 118 includes a horizontal portion 118A adjacent to the gate line and parallel therewith, and a finger portion 118B extended, portion parallel to the pixel electrode 114, from the horizontal portion 118A into the pixel area. The common electrode 118 is formed from a third conductive layer (i.e., a transparent layer or titanium) within a hole 164 for common electrode defined at the pixel area. The hole 164 for common electrode is formed passing through the protective film 152 and the gate insulating film 146. The hole 164 for the common electrode exposes a portion of the first common line 116A overlapping the finger portion 118B of the common electrode 118, thereby connecting the common electrode 118 to the first common line 116A. Herein, if an opaque metal such as titanium (Ti) is used as the third conductive layer, light leakage through the common electrode 118 at the pixel area can be prevented.

The pixel electrode 114 is connected to the drain electrode 112 of the thin film transistor 106 and, together with the common electrode 118, forms a horizontal electric field, in the pixel area. To this end, the pixel electrode 114 comprises a horizontal portion 114A provided parallel to the gate line 102 and connected to the drain electrode 112, and a finger portion 114B extended from the horizontal portion 114A into the pixel area parallel to the finger portion 118B of the common electrode 118. The pixel electrode 114 is formed from the second conductive layer along with the data line 104, the source electrode 110, and the drain electrode 112. Thus, a horizontal electric field is formed between the pixel electrode 114 to which a pixel signal is applied via the thin film transistor 106 and the common electrode 118 and the second common line 116B to which a reference voltage is applied via the common line 116. Liquid crystal molecules arranged in the horizontal direction between the thin film transistor substrate and the color filter substrate the horizontal electric field is rotated due to a dielectric anisotropy. Transmittance of a light transmitting the pixel area is differentiated depending upon a rotation extent of the liquid crystal molecules, thereby implementing a gray level scale.

The storage capacitor comprises a portion of the first common line 116A responsible for a first lower storage electrode, and the upper storage electrode 122 overlapping a portion of the first common line 116A with the gate insulating film 146, the active layer 148 and the ohmic contact layer 150 therebetween. Herein, the upper storage electrode 122 is connected between the finger portion 114B of the pixel electrode 114 crossing the first common line 116A, and is formed from the second conductive layer along with the pixel electrode 114. The storage capacitor allows a pixel signal charged in the pixel electrode 114 to be stably maintained until the next pixel signal is charged.

The gate line 102 is connected to a gate driver (not shown) via the gate pad 125. The gate pad 125 consists of a lower gate pad electrode 124 extended from the gate line 102, and an upper gate pad electrode 128 connected to the lower gate pad electrode 124 via a first contact hole 166 going through the gate insulating film 146 and the protective film 152.

The common line 116 receives a reference voltage from an external reference voltage source (not shown) through the common pad 135. The common pad 135 includes a lower common pad electrode 136 extended from the common line 116, and an upper common pad electrode 140 connected to the lower common pad electrode 136 via a second contact hole 170 going through the gate insulating film 146 and the protective film 152.

The data line 104 is connected to the data driver (not shown) via the data pad 131. The data pad 131 includes a lower data pad electrode 130 extended from the data line 104, and an upper data pad electrode 134 connected to the lower data pad electrode 130 via a third contact hole 168 going through the protective film 152.

In the thin film transistor substrate, the upper gate pad electrode 128, the upper data pad electrode 134 and the upper common pad electrode 140 are formed from a third conductive layer along with the common electrode 118. The third conductive layer is patterned by a lift-off process to remove the photo-resist pattern used for patterning the protective film 152 and the gate insulating film 146. Thus, the patterned third conductive layer makes an interface with the protective film 152. The thin film transistor substrate according to the exemplary embodiment of the present invention can eliminate one mask process for patterning the third conductive layer by the application of the lift-off process. In this case, the common electrode hole 164 is used as a stripper penetration path along with the first to third contact holes 166, 170 and 168, thereby enhancing lift-off ability of the photo-resist pattern.

A method of fabricating the thin film transistor substrate according to the exemplary embodiment of the present invention having such advantages will be described in detail below.

Figure 6A:
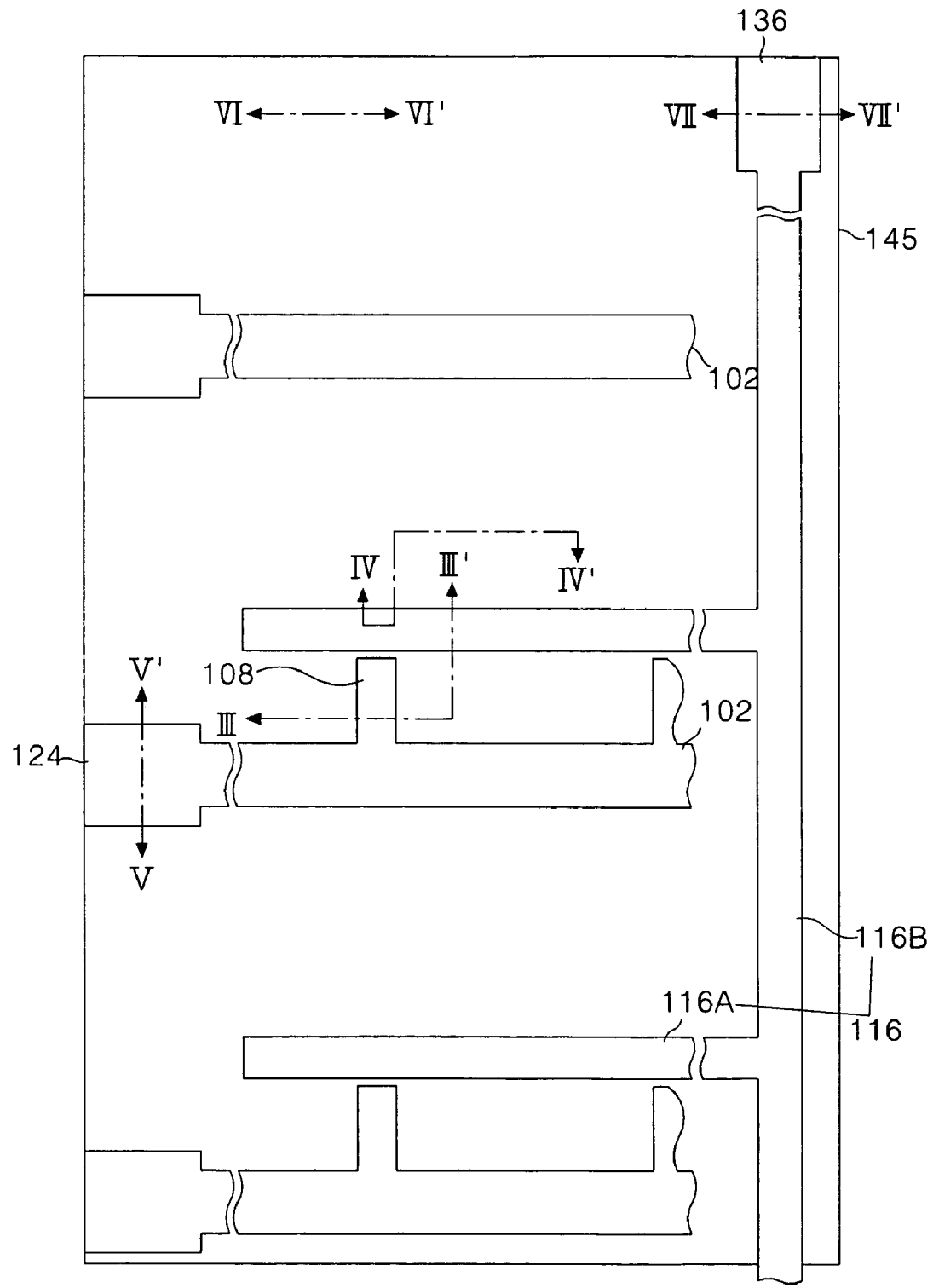
FIG. 6A and FIG. 6B are respectively a plan view and a cross-sectional view for explaining a first mask process in a fabricating method of the thin film transistor substrate according to an exemplary embodiment of the present invention.
Figure 6B:
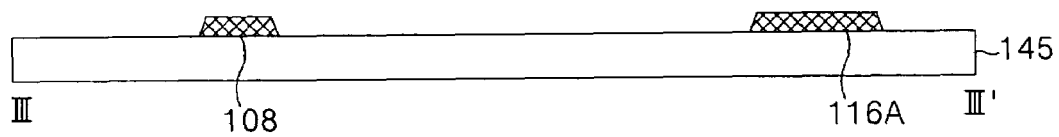
Figure 6B:
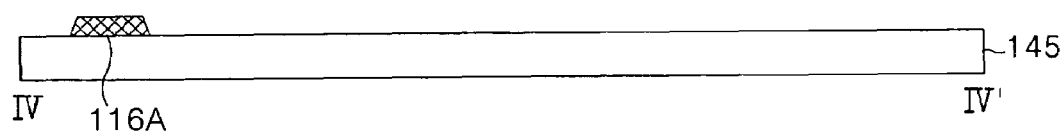
Figure 6B:
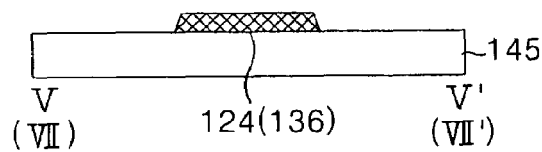
Figure 6B:
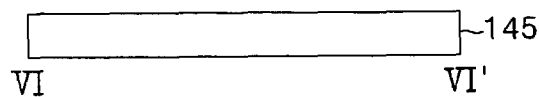

FIG. 6A and FIG. 6B are respectively a plan view and a cross-sectional view for explaining a first mask process in a fabricating method of the thin film transistor substrate using a horizontal electric field according to the exemplary embodiment of the present invention.

As shown in FIG. 6A and FIG. 6B, a first conductive pattern group including the gate line 102, the gate electrode 108, the lower gate pad electrode 124, the common line 116 and the lower common pad electrode 136 is provided on the lower substrate 145 by the first mask process. More specifically, a first conductive layer is formed on the upper substrate 145 by a deposition technique such as sputtering. Then, the first conductive layer is patterned by photolithography and etching using a first mask, thereby forming the first conductive pattern group including the gate line 102, the gate electrode 108, the lower gate pad electrode 124, the common line 116 and the lower common pad electrode 136. Herein, the first conductive layer is formed from Cr, MoW, Cr/Al, Cu, Al(Nd), Mo/Al, Mo/Al(Nd), Cr/Al(Nd), or other suitable material.

Figure 7A:
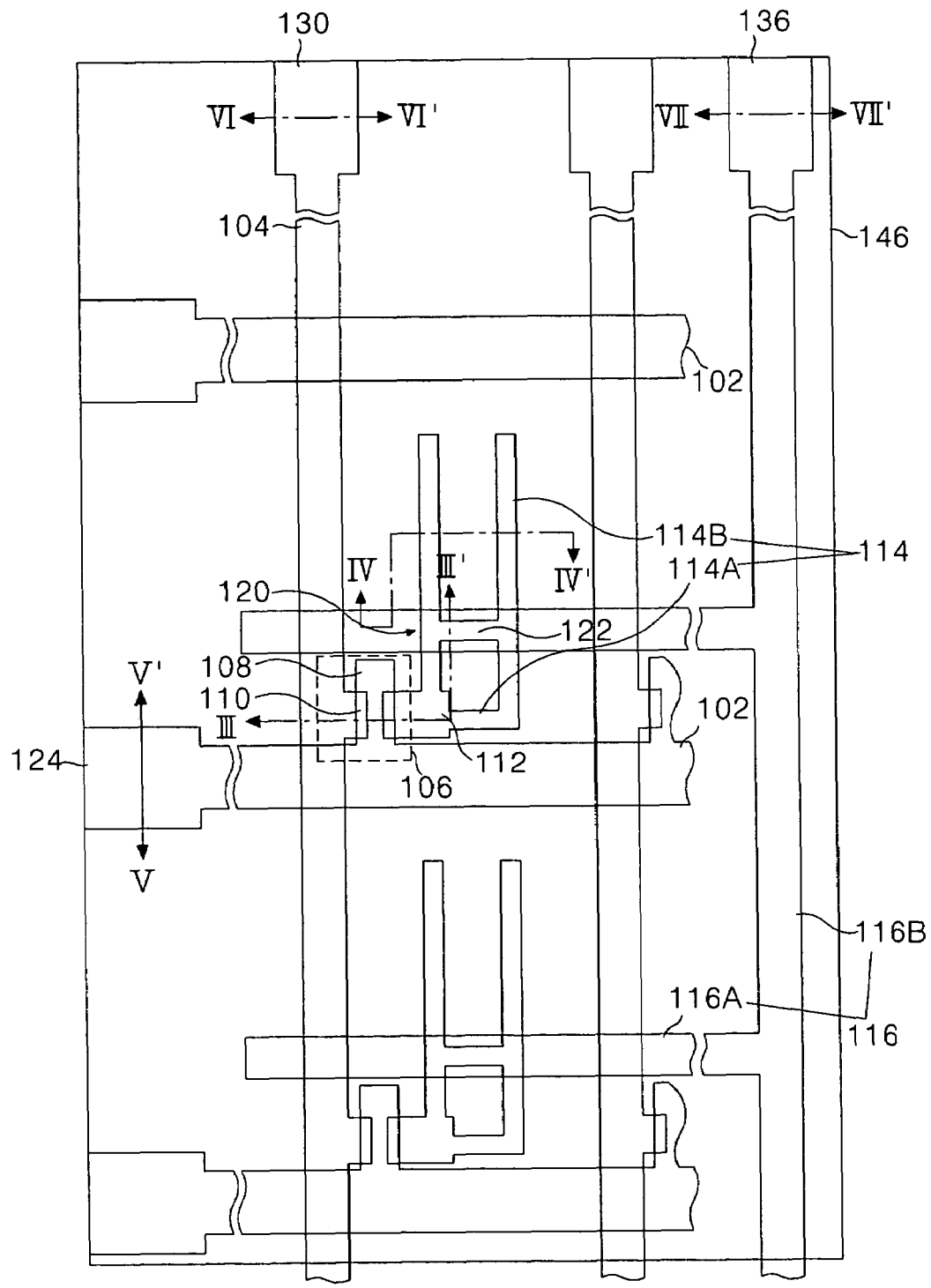
FIG. 7A and FIG. 7B are respectively a plan view and a cross-sectional view for explaining a second mask process in a fabricating method of the thin film transistor substrate according to an exemplary embodiment of the present invention.
Figure 7B:
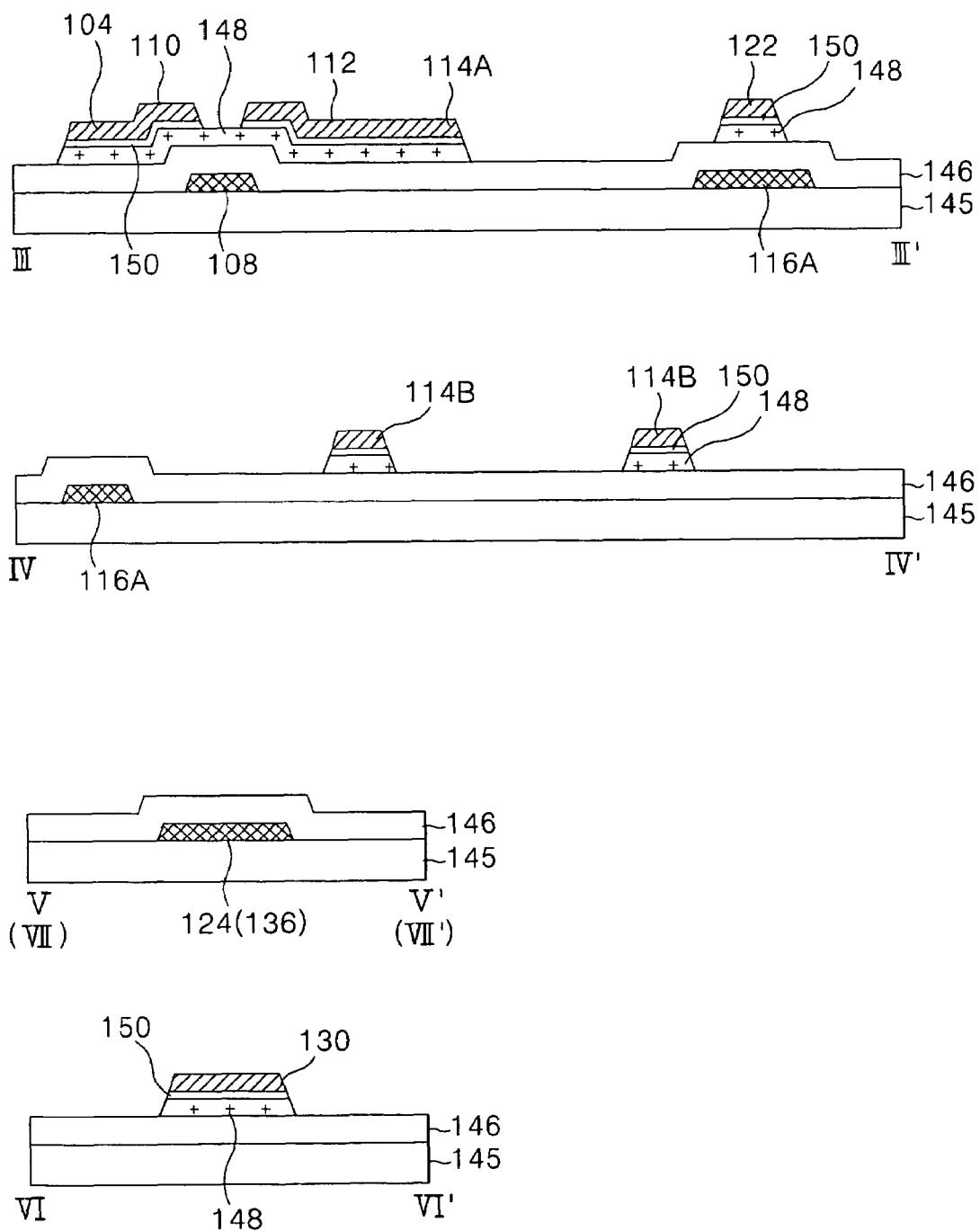

FIG. 7A and FIG. 7B are exemplary a plan view and a cross-sectional view for explaining a second mask process in a fabricating method of the thin film transistor substrate using a horizontal electric field according to the exemplary embodiment of the present invention. FIG. 8A to FIG. 8E are cross-sectional views for specifically explaining the second mask process.

First, the gate insulating film 146 is formed on the lower substrate 145 provided with the gate metal pattern group by deposition techniques such as plasma enhanced chemical vapor deposition (PECVD), sputtering or the like. Herein, the gate insulating film 146 is formed from an inorganic insulating material such as silicon nitride ($SiN_x$) or silicon oxide ($SiO_x$).

As shown in FIG. 7A and FIG. 7B, a semiconductor pattern including the active layer 148 and the ohmic contact layer 150 is disposed on the gate insulating film 146; and a second conductive pattern group including the data line 104, the source electrode 110, the drain electrode 112, the pixel electrode 114, the lower data pad electrode 130, and the upper storage electrode 122 are provided by the second mask process. Herein, the pixel electrode 114 is formed an opaque second transparent layer, thereby preventing a light leakage caused by them.

Figure 8A:
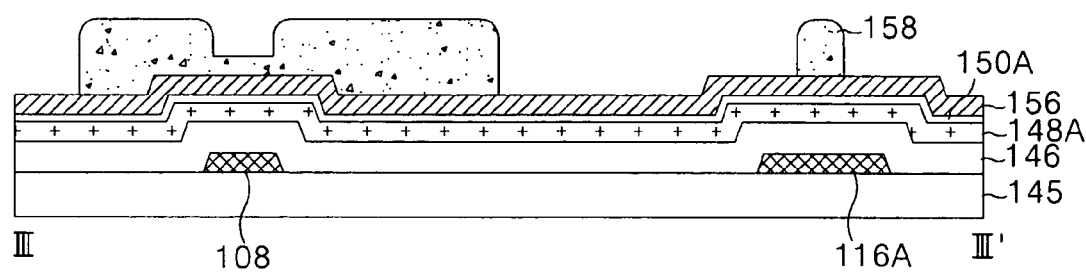
FIG. 8A to FIG. 8D are cross-sectional views for specifically explaining the second mask process in a fabricating method of the thin film transistor substrate according to an exemplary embodiment of the present invention.
Figure 8A:
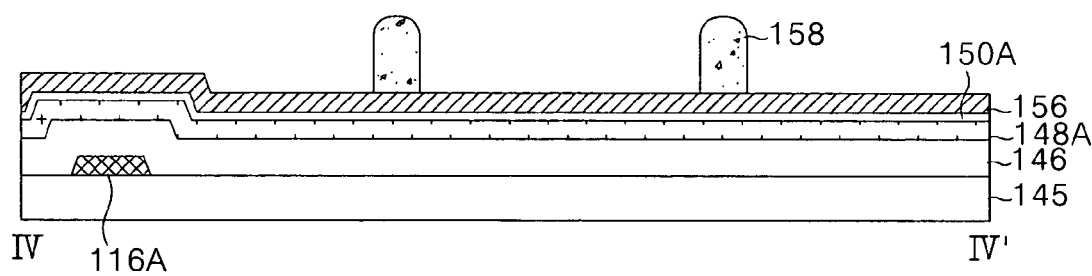
Figure 8A:
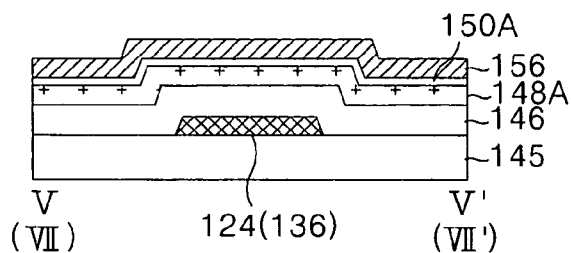
Figure 8A:
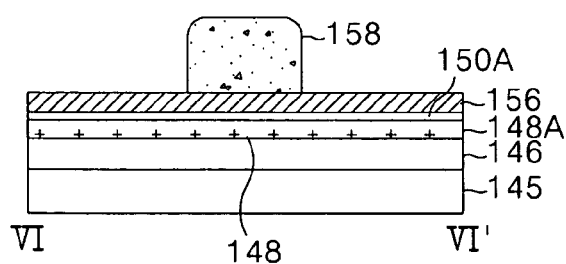

More specifically, as shown in FIG. 8A, an amorphous silicon layer 148A, an n$^+$ amorphous silicon layer 150A and the second conductive layer 156 are sequentially formed on the gate insulating film 146 by deposition techniques such as plasma enhanced chemical vapor deposition (PECVD), sputtering, etc. Herein, the second conductive layer 156 is formed from Cr, MoW, Cr/Al, Cu, Al(Nd), Mo/Al, Mo/Al(Nd), Cr/Al(Nd), or other suitable material.

Next, a photo-resist film is entirely coated onto the second conductive layer 156 and then a photo-resist pattern 158 having step coverage as shown in FIG. 8A is formed thereon by photolithography using a second mask that is a partial-exposure mask. In this case, a partial-exposure mask having a diffractive exposing portion (or a semi-transmitting or transflective portion) at a portion where a channel of the thin film transistor is to be formed is used as the second mask. Thus, the photo-resist pattern 158 corresponding to the diffractive exposing portion (or the semi-transmitting portion) of the second mask has a height lower than that of the photo-resist pattern 158 corresponding to a transmitting portion (or a shielding portion) of the second mask. In other words, the photo-resist pattern 158 at the channel portion has a height lower than that of photo-resist pattern 158 at other source/drain metal pattern group portion.

Figure 8B:
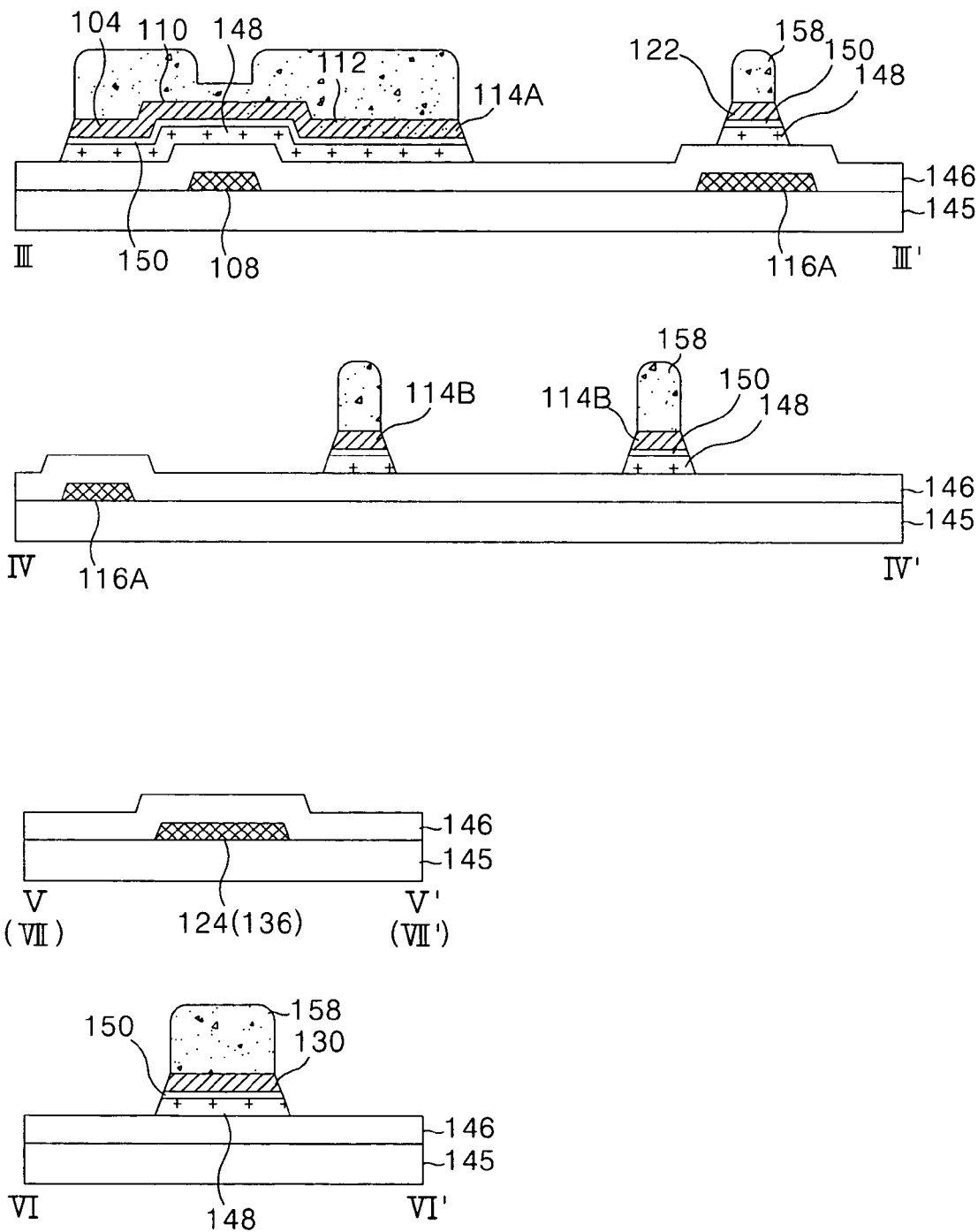

Subsequently, the second conductive layer 156 is patterned by a wet etching process using the photo-resist pattern 158. Thus, the second conductive metal pattern group including the data line 104, the source electrode 110 protruded from the data line 104, the drain electrode 112 integral to the source electrode 110, the pixel electrode 114 integral to the drain electrode 112, the lower data pad electrode 130 extended from the data line 104, and the upper storage electrode 122 integral to the pixel electrode 114 is provided as shown in FIG. 8B. Herein, the upper storage electrode 122 is connected between the finger portion 114B of the pixel electrode 114 overlapping the first common line 116A. Further, the n$^+$ amorphous silicon layer 150A and the amorphous silicon layer 148A are patterned at the same time by a dry etching process using the same photo-resist pattern 158, thereby providing a structure in which the ohmic contact layer 150 and the active layer 148 are formed along the second conductive pattern group as shown in FIG. 8B.

Figure 8C:
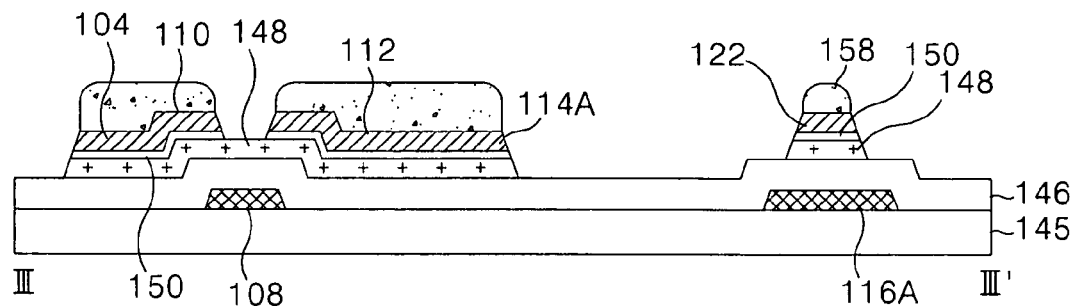
Figure 8C:
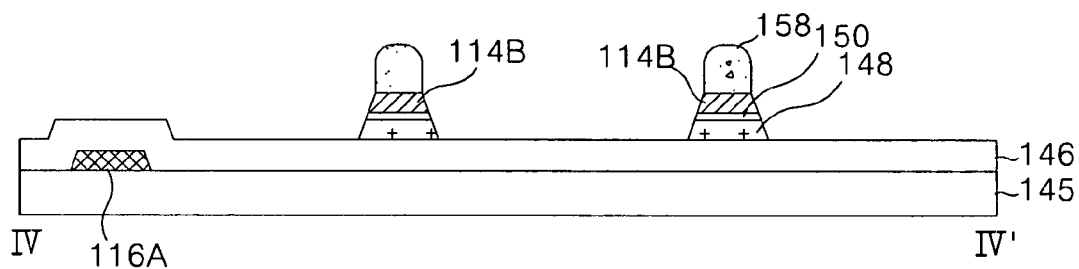
Figure 8C:
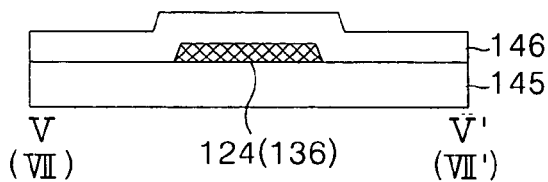
Figure 8C:
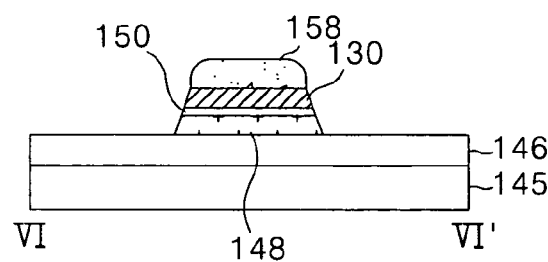

Next, the photo-resist pattern 158 at the channel portion having a relatively low height is removed as shown in FIG. 8C by ashing using an oxygen ($O_2$) plasma while the photo-resist pattern 158 at other second conductive pattern group portion has a lower height. The second conductive layer and the ohmic contact layer 150 are etched from a portion at which the channel is formed as shown in FIG. 8C by the dry etching process using the photo-resist pattern 158 left in this manner, thereby disconnecting the source electrode 110 from the drain electrode 112 and exposing the active layer 148. Thus, a channel made from the active layer 148 is formed between the source electrode 110 and the drain electrode 112.

Figure 8D:
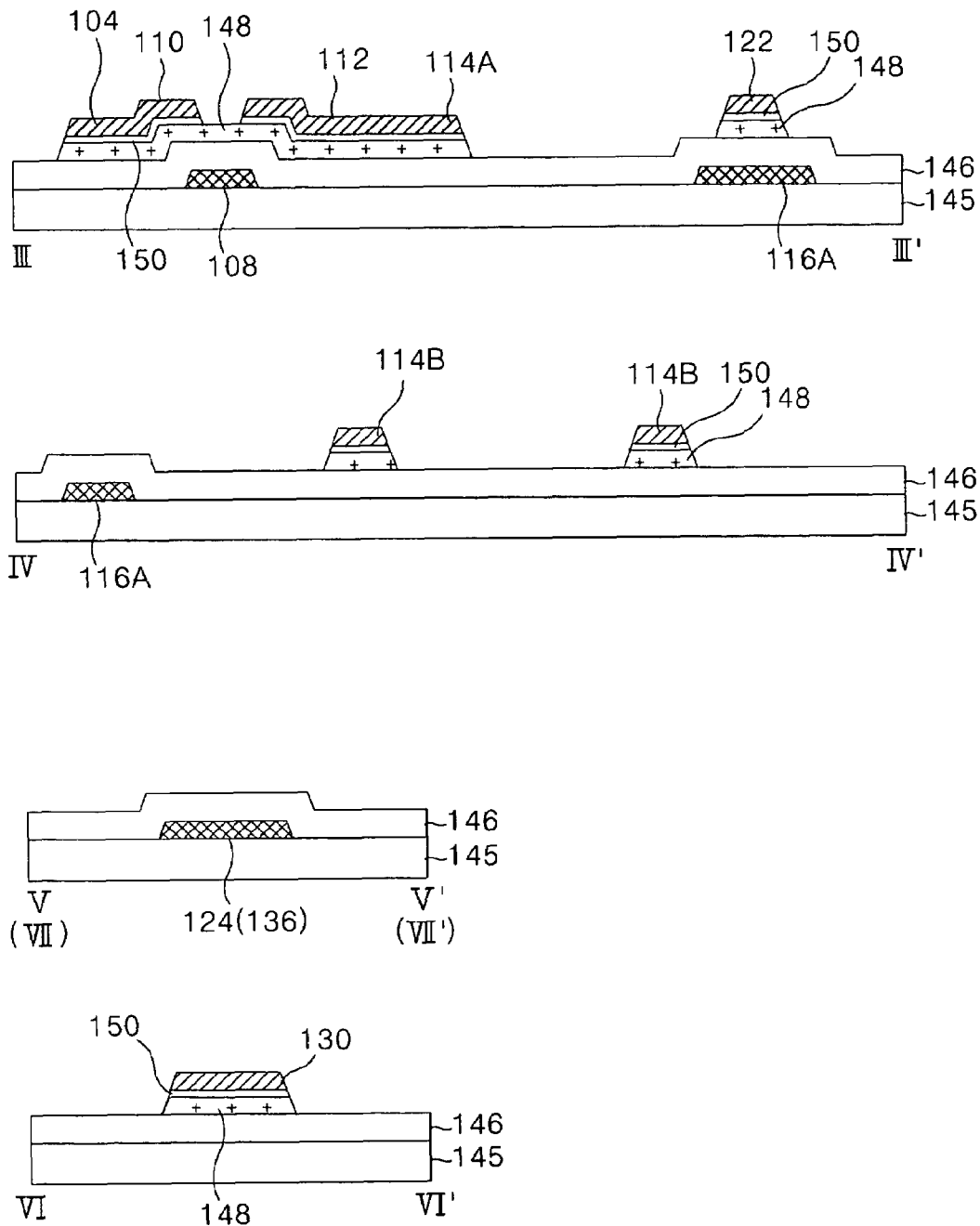

Then, the photo-resist pattern 158 left on the second conductive pattern group portion is entirely removed as shown in FIG. 8D by the stripping process.

Figure 9A:
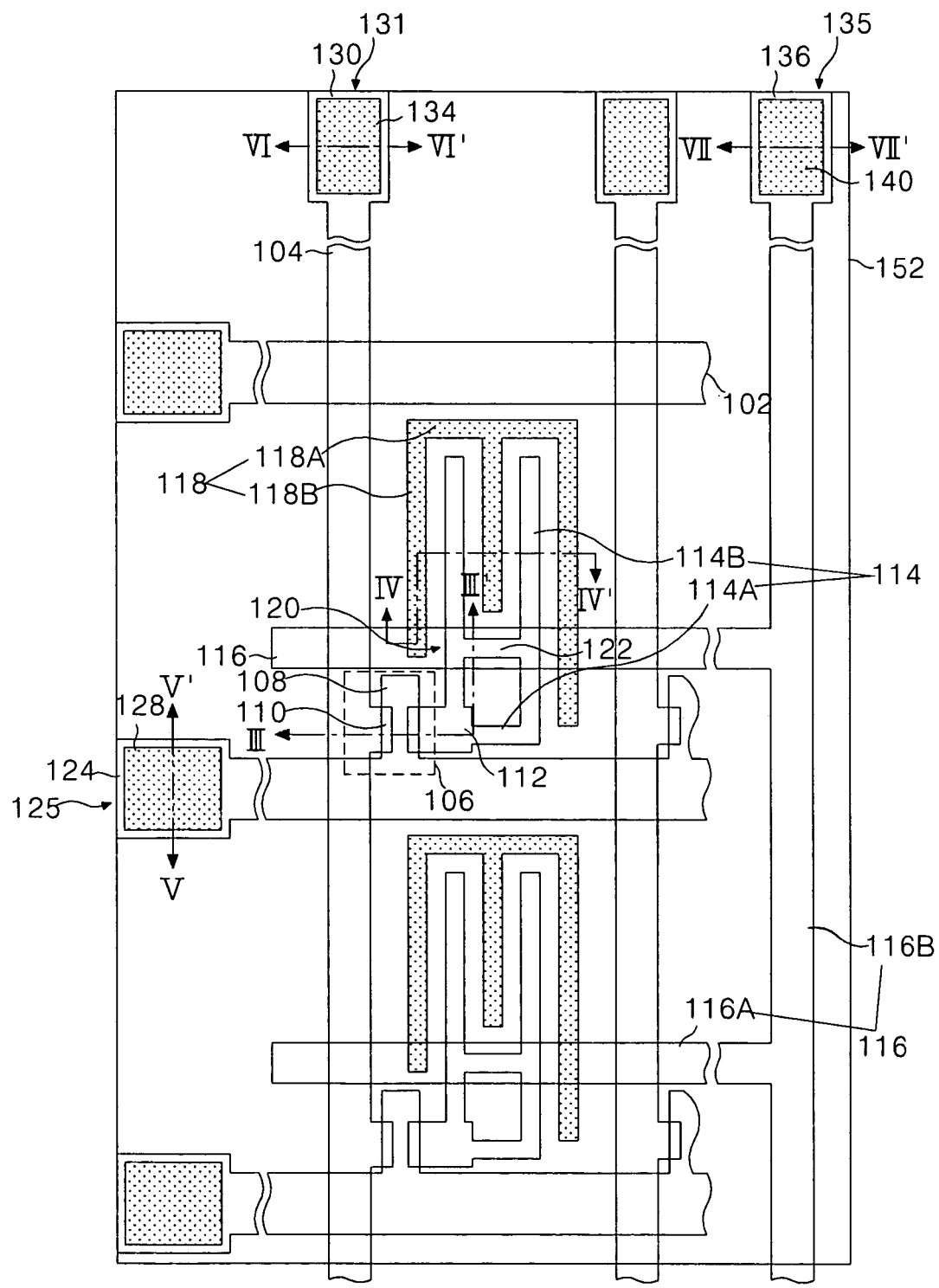
FIG. 9A and FIG. 9B are respectively a plan view and a cross-sectional view for explaining a third mask process in a fabricating method of the thin film transistor substrate according to an exemplary embodiment of the present invention.
Figure 9B:
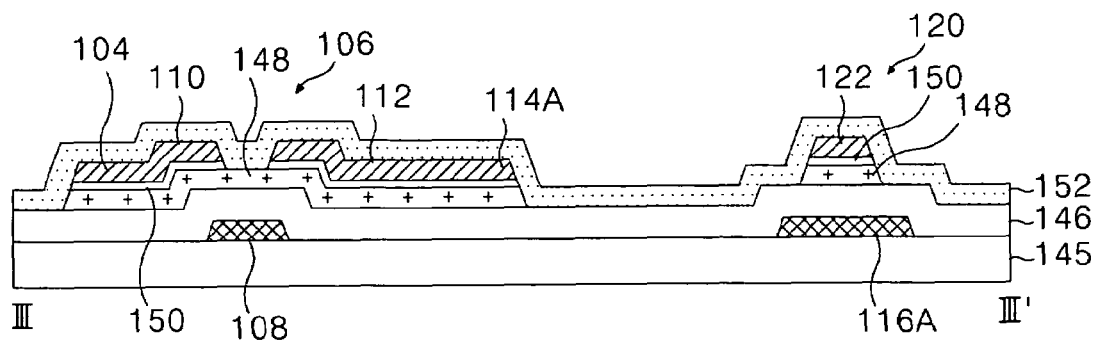
Figure 9B:
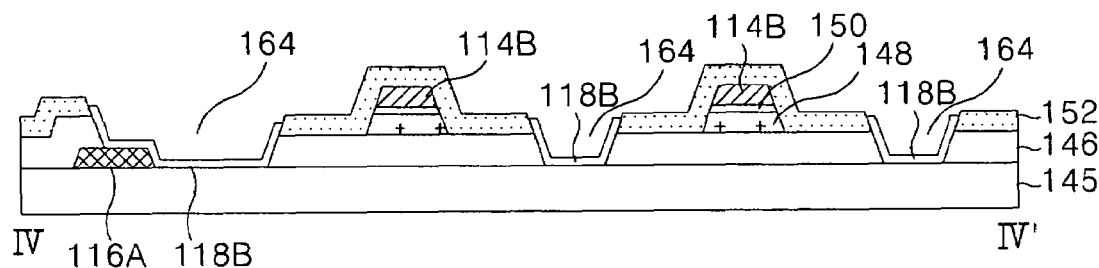
Figure 9B:
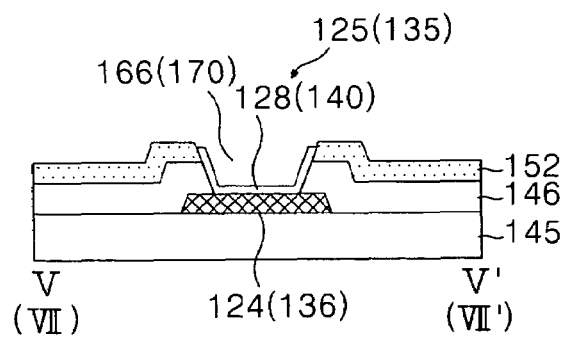
Figure 9B:
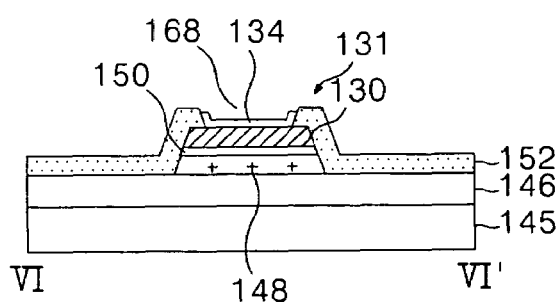

FIG. 9A and FIG. 9B are respectively a plan view and a cross-sectional view for explaining a third mask process in a fabricating method of the thin film transistor substrate using a horizontal electric field according to the exemplary embodiment of the present invention. FIG. 10A to FIG. 10D are cross-sectional views for specifically explaining the second mask process.

As shown in FIG. 9A and FIG. 9B, the protective film 152 and the gate insulating film 146 are patterned by the third mask process. Thus, a third conductive pattern group including the common electrode 118, the upper gate pad electrode 128, the upper data pad electrode 134 and the upper common pad electrode 140 is formed. The third conductive pattern group makes an interface with the patterned protective film 152 without any overlapped portions.

Figure 10A:
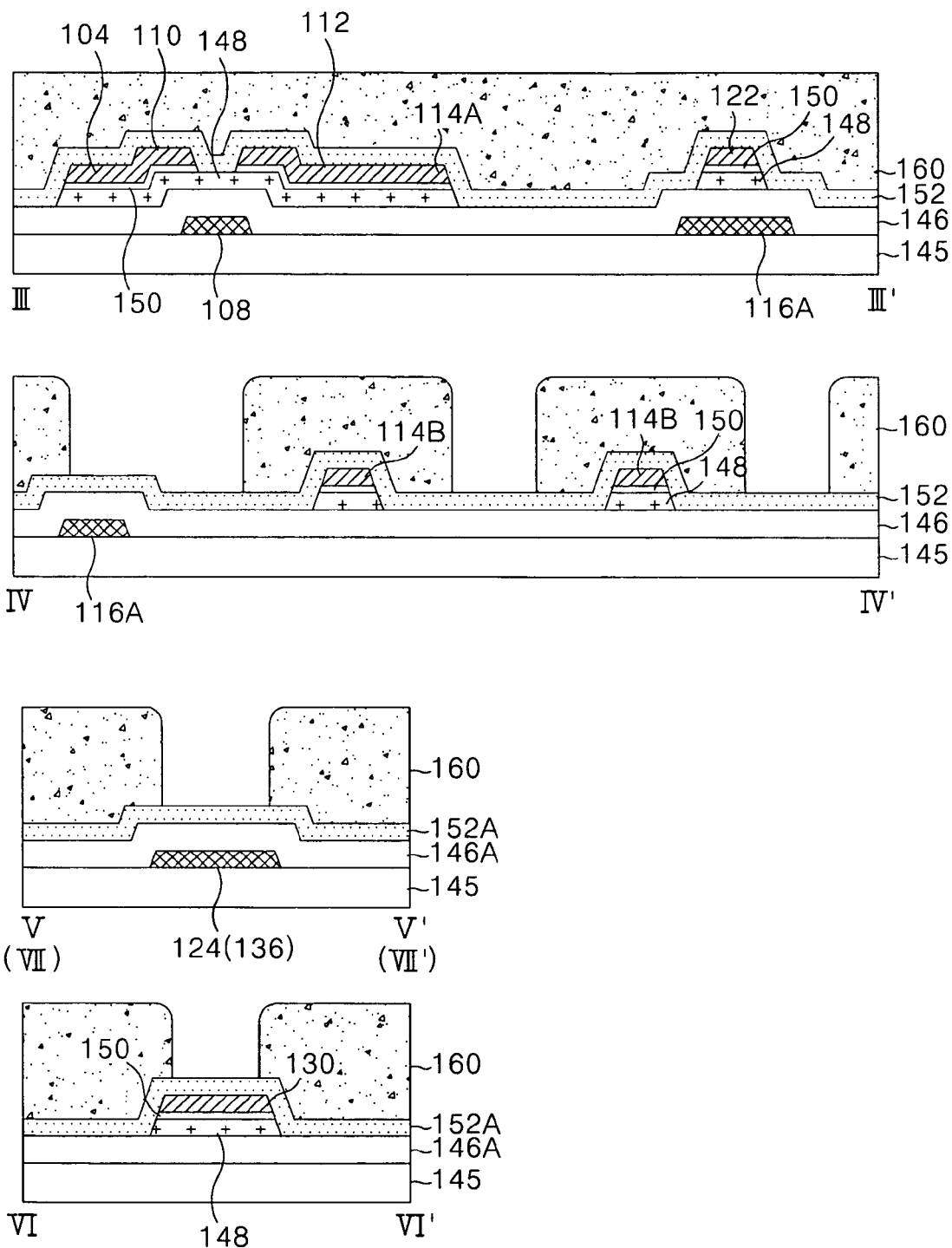
FIG. 10A to FIG. 10D are cross-sectional views for specifically explaining the third mask process in a fabricating method of the thin film transistor substrate according to an exemplary embodiment of the present invention.
Figure 10B:
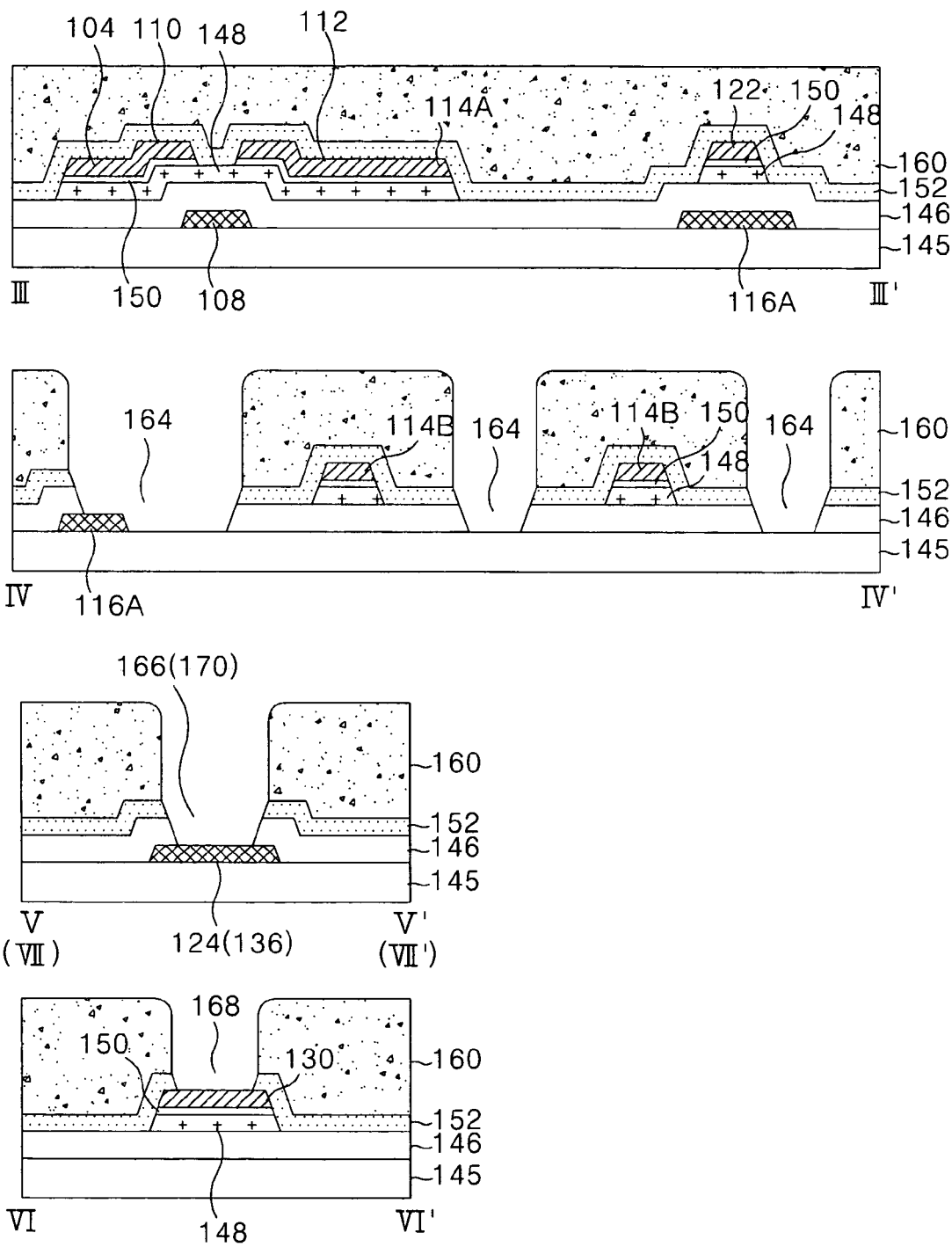

More specifically, the protective film 152 is entirely formed on the gate insulating film 146 provided with the second conductive pattern group as shown in FIG. 10A. Herein, the protective film 152 is formed from an inorganic insulating material or an organic insulating material similar to the gate insulating film 146. Further, a photo-resist pattern 160 is formed at a portion where the protective film 152 must exist as shown in FIG. 10A by photolithography using a third mask.

Next, the protective film 152 and the gate insulating film 146 are patterned by dry etching using the photo-resist pattern 160, thereby providing the hole 164 for the common electrode and the first to third contact holes 166, 170 and 168 passing through the protective film 152 (or the protective film 152 and the gate insulating film 146). Herein, the hole 164 for the common electrode passes through the protective film 152 and the gate insulating film 146 at a portion where the common electrode is to be formed, thereby exposing a portion of the first common line 116A. Further, the first to third contact holes 166, 170 and 168 respectively expose the lower gate pad electrode 124, the lower common pad electrode 136 and the lower data pad electrode 130.

Figure 10C:
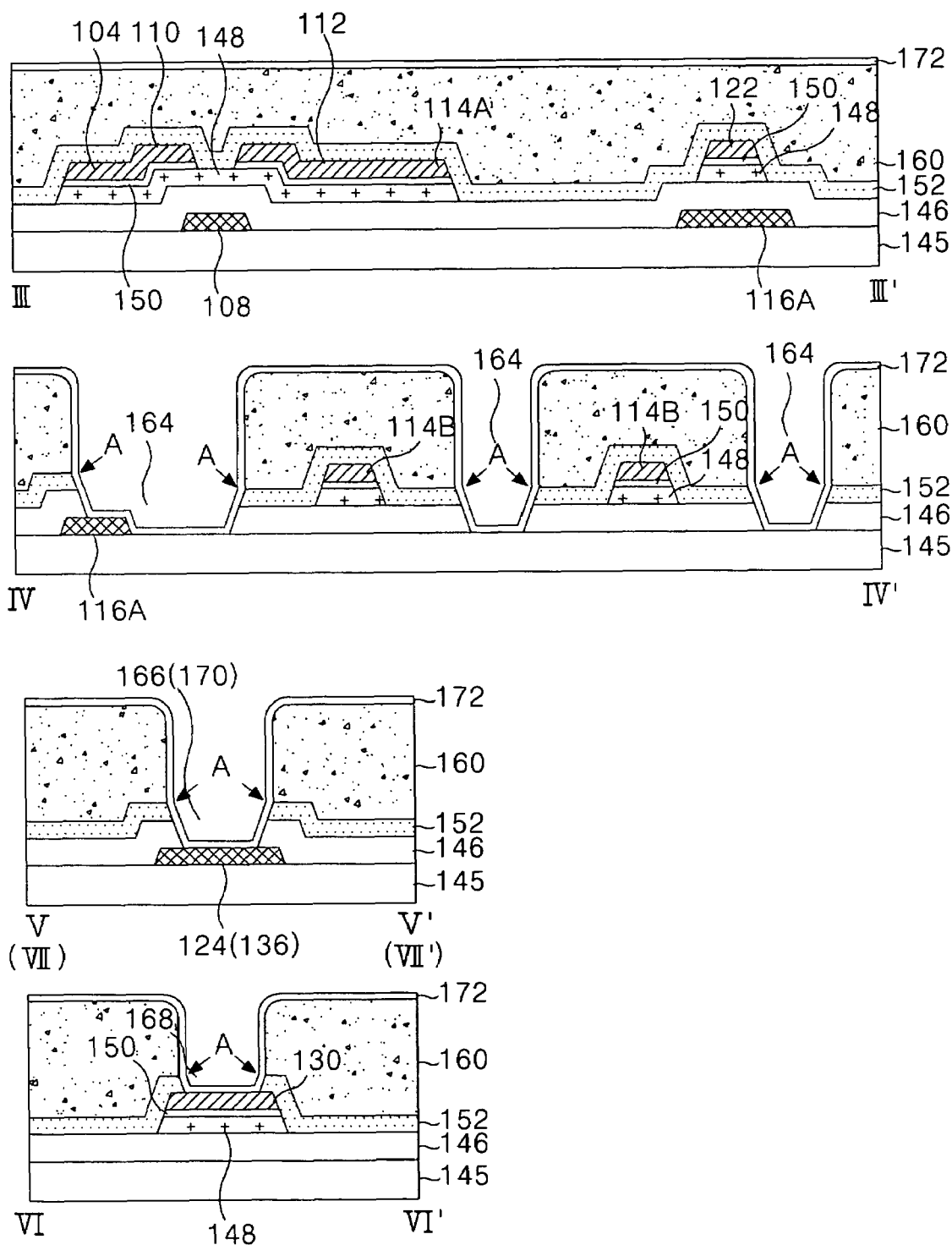

Subsequently, a third conductive layer 172 is entirely formed on the thin film transistor substrate in which the photo-resist pattern 160 exists as shown in FIG. 10C by a deposition technique such as sputtering or the like. The third conductive layer 172 is formed from a transparent conductive film containing indium-tin-oxide (ITO), tin-oxide (TO), indium-zinc-oxide (IZO) or $SnO_2$, etc. Alternatively, the third conductive film 172 is formed from a metal layer having a high corrosion-resistance and a high strength such as titanium (Ti) or tungsten (W).

Figure 10D:
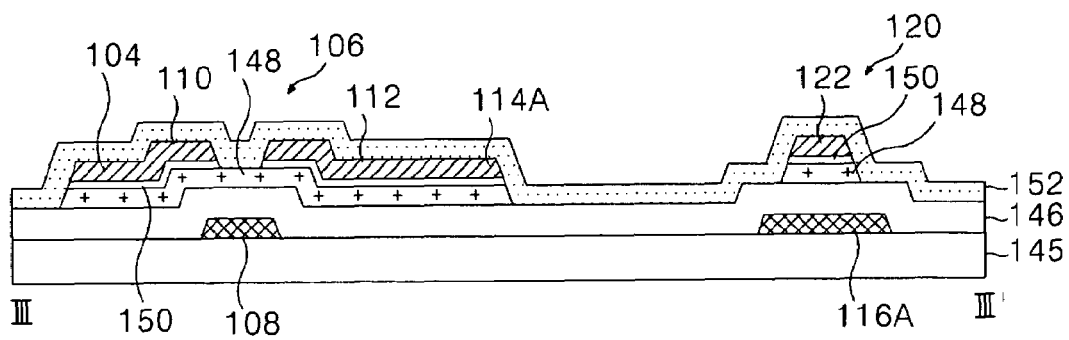
Figure 10D:
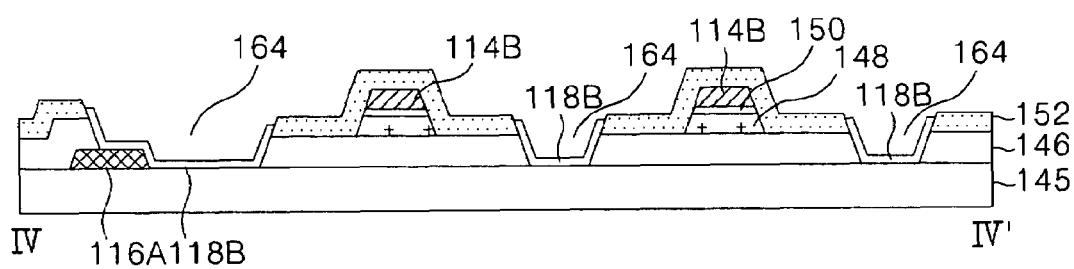
Figure 10D:
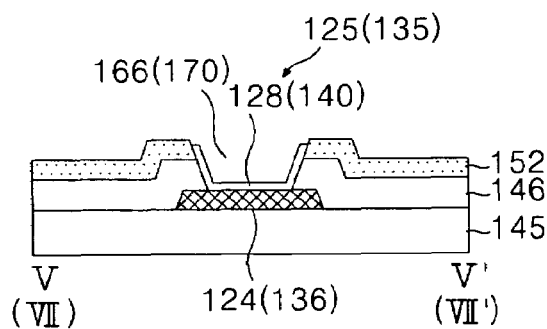
Figure 10D:
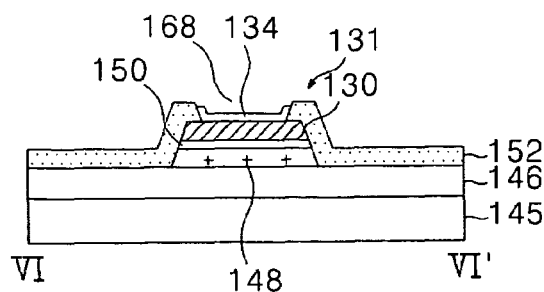

The photo-resist pattern 160, along with the third conductive layer 172 thereon, is removed by the lift-off process, thereby patterning the third conductive layer 172. Thus, the common electrode 118, the upper gate pad electrode 128, the upper common pad electrode 140, and the upper data pad electrode 134 are respectively provided at the hole 164 for the common electrode and the first to third contact holes 166, 170 and 168, as shown in FIG. 10D.

In this case, the hole 165 for the common electrode and the first to third contact holes 162, 166 and 170 are provided at a portion in which the photo-resist pattern 160 does not exist as a stripper penetration path for allowing a greater amount of stripper A to be infiltrated into the interface portion between the photo-resist pattern 160 and the protective film 152. As a result, the photo-resist pattern 160 covered with the third conductive layer 172 can be easily separated from the protective film 152 by the stripper A. Easier separation is achieved because the edge of the photo-resist pattern 160 has a more protruded shape (not shown) than the edge of the protective film 152 at a portion where the hole 164 for common electrode and the first to third contact holes 162, 166 and 170 have been provided due to over-etching of the protective film 152. Further, easier separation is achieved because the third conductive layer 172 deposited with linearity between the edge of the photo-resist pattern 160 and the edge of the protective film 152 is opened, or relatively thinly deposited by the protruded edge of the photo-resist pattern 160, thereby easily being easily infiltrated by the stripper.

As mentioned above, an unnecessary portion of the third conductive layer 172, along with the photo-resist pattern 160, is removed by the lift-off process, thereby providing the third conductive pattern group making an interface with the protective film 152. More specifically, the common electrode 118 is provided within the hole 164 for common electrode to be connected to the exposed first common line 116A. The upper gate pad electrode 128, the upper common pad electrode 140 and the upper data pad electrode 134 are respectively provided within the corresponding contact holes 166, 170 and 168 to be connected to the lower gate pad electrode 124, the lower common pad electrode 136 and the lower data pad electrode 130.

Herein, if titanium (Ti) is used as the third conductive layer 172, light leakage through the common electrode 118 and the pixel electrode 114 can be prevented. Moreover, electrochemical corrosion, tearing, etc. of the pad portion can be prevented. Thus, reliability can be assured.

As described above, according to the present invention, the lift-off process is employed to reduce the mask process for the third conductive layer. Accordingly, the thin film transistor substrate is fabricated by the three-round mask process, so that the fabrication process can be simplified to reduce the manufacturing cost and improve the production yield. Furthermore, according to the present invention, the hole for the common electrode and the first to third contact holes provided through the protective film are used as stripper penetration paths, thereby effectively improving lift-off ability of the photo-resist pattern covered with the third conductive layer.

It will be apparent to those skilled in the art that various modifications and variations can be made in the thin film transistor substrate of using a horizontal electronic field and fabricating method thereof of the present invention without departing from the spirit or scope of the invention. Thus, it is intended that the present invention cover the modifications and variations of this invention provided they come within the scope of the appended claims and their equivalents.

What is claimed is:

1. A thin film transistor substrate structure for using a horizontal electric field, comprising:
   a substrate;
   a gate line and a common line formed on the substrate parallel to each other from a first conductive layer;
   a gate insulating film formed on the substrate, the gate line, and the common line;
   a data line formed from a second conductive layer on the gate insulating film crossing the gate line and the common line with the gate insulating film therebetween to define a pixel area;
   a thin film transistor connected to the gate line and the data line;
   a protective film covering the data line and the thin film transistor;

a common electrode formed from a third conductive layer connected to the common line, the common electrode deposed within a hole passing through the protective film and the gate insulating film;

a pixel electrode formed from the second conductive layer, wherein the pixel electrode is extended from a drain electrode of the thin film transistor to define a horizontal electric field between the pixel electrode and the common electrode; and a gate pad having a lower gate pad electrode formed from the first conductive layer connected to the gate line, and an upper gate pad electrode formed from the third conductive layer connected to the lower gate pad electrode through a first contact hole defined through the protective film and the gate insulating film.

2. The thin film transistor substrate structure according to claim 1, further comprising a common pad having a lower common pad electrode formed from the first conductive layer connected to the common line, and an upper common pad electrode formed from the third conductive layer connected to the lower common pad electrode through a second contact hole defined through the protective film and the gate insulating film.

3. The thin film transistor substrate structure according to claim 2, further comprising a data pad having a lower data pad electrode formed from the second conductive layer connected to the data line, and an upper data pad electrode formed from the third conductive layer connected to the lower data pad electrode through a third contact hole defined through the protective film.

4. The thin film transistor substrate structure according to claim 3, wherein the common electrode, the upper gate pad electrode, the upper common pad electrode, and the upper data pad electrode interface the protective film within respective ones of the hole, the first contact hole, the second contact hole, and the third contact hole.

5. The thin film transistor substrate structure according to claim 1, further comprising a storage capacitor is defined by a lower storage electrode defined by a portion of the common line, an upper storage electrode connected to the pixel electrode, and a portion of the gate insulating film between the lower storage electrode and the upper storage electrode.

6. The thin film transistor substrate structure according to claim 1, wherein the common electrode is connected to a portion of the common line through the hole.

7. The thin film transistor substrate structure according to claim 5, wherein a semiconductor layer included in the thin film transistor overlaps with one of the data line, the lower data pad electrode, and the upper storage electrode.

* * * * *